(12) United States Patent
Mohan et al.

(10) Patent No.: US 12,086,511 B2
(45) Date of Patent: Sep. 10, 2024

(54) COLLISION FILTERING FOR AUTONOMOUS VEHICLE SIMULATIONS

(71) Applicant: Nuro, Inc., Mountain View, CA (US)

(72) Inventors: Varun Krish Mohan, San Jose, CA (US); Chuan Qiu, Mountain View, CA (US)

(73) Assignee: NURO, INC., Mountain View, CA (US)

( * ) Notice: Subject to any disclaimer, the term of this patent is extended or adjusted under 35 U.S.C. 154(b) by 826 days.

(21) Appl. No.: 17/098,609

(22) Filed: Nov. 16, 2020

(65) Prior Publication Data

US 2021/0165932 A1 Jun. 3, 2021

Related U.S. Application Data

(60) Provisional application No. 62/945,421, filed on Dec. 9, 2019, provisional application No. 62/942,484, filed on Dec. 2, 2019.

(51) Int. Cl.
*G06F 30/20* (2020.01)
*B60W 30/09* (2012.01)
(Continued)

(52) U.S. Cl.
CPC .............. *G06F 30/15* (2020.01); *B60W 30/09* (2013.01); *B60W 30/0956* (2013.01);
(Continued)

(58) Field of Classification Search
CPC ........ G06F 30/15; G06F 30/20; G06F 18/241; G06F 8/60; G06F 8/71; G06F 11/3664;
(Continued)

(56) References Cited

U.S. PATENT DOCUMENTS 11,577,741 B1 * 2/2023 Reschka ............. B60W 50/045
2017/0329332 A1 * 11/2017 Pilarski ............. B60W 30/0956
(Continued)

OTHER PUBLICATIONS

Althoff, Matthias et al. "Model-Based Probabilistic Collision Detection in Autonomous Driving". Jun. 2009, IEEE, IEEE Transactions on Intelligent Transportation Systems, vol. 10, No. 2, pp. 299-310 (Year: 2009).*
(Continued)

*Primary Examiner* — John E Johansen
(74) *Attorney, Agent, or Firm* — Edell, Shapiro & Finnan, LLC

(57) ABSTRACT

Collision filtering for autonomous vehicle simulations is disclosed herein. A simulation system can be configured to identify a simulated collision involving a simulated autonomous vehicle and a simulated agent representing an obstacle with which the simulated autonomous vehicle may collide. For example, the simulated collision can be simulated based on logged data from a real-world autonomous vehicle. The simulation system can classify the simulated collision as unrealistic or realistic. For example, classification can involve considering a nature of the simulated agent (including, e.g., whether the simulated agent is a drivable obstacle), a nature of the collision, whether the collision is avoidable through an evasive maneuver, whether the collision is similar to a known false positive, and/or input from a human operator. The simulation system can filter the simulated collision from participating in a collision triage analysis in response to classifying the simulated collision as an unrealistic simulated collision.

28 Claims, 10 Drawing Sheets

(51) Int. Cl.
*B60W 30/095* (2012.01)
*B60W 60/00* (2020.01)
*G06F 8/60* (2018.01)
*G06F 8/71* (2018.01)
*G06F 11/34* (2006.01)
*G06F 11/36* (2006.01)
*G06F 18/22* (2023.01)
*G06F 18/241* (2023.01)
*G06F 30/15* (2020.01)
*G06V 20/58* (2022.01)
*G06F 11/30* (2006.01)
*G06F 30/27* (2020.01)

(52) U.S. Cl.
CPC ........... *B60W 60/0015* (2020.02); *G06F 8/60* (2013.01); *G06F 8/71* (2013.01); *G06F 11/3476* (2013.01); *G06F 11/3664* (2013.01); *G06F 11/3688* (2013.01); *G06F 11/3692* (2013.01); *G06F 18/22* (2023.01); *G06F 18/241* (2023.01); *G06F 30/20* (2020.01); *G06V 20/58* (2022.01); *G06F 11/3013* (2013.01); *G06F 30/27* (2020.01)

(58) Field of Classification Search
CPC .. G06F 30/27; G06F 11/3476; G06F 11/3688; G06F 11/3692; G06F 18/22; G06F 11/3013; B60W 60/0015; B60W 30/09; B60W 30/0956; G06V 20/58

USPC ........................................................... 703/8
See application file for complete search history.

(56) References Cited

U.S. PATENT DOCUMENTS

| | | | |
|---|---|---|---|
| 2018/0136651 A1* | 5/2018 | Levinson | G05D 1/0027 |
| 2018/0322230 A1* | 11/2018 | Han | B60W 30/00 |
| 2018/0341571 A1* | 11/2018 | Kislovskiy | G06F 11/0778 |
| 2019/0303718 A1* | 10/2019 | Tanigawa | G06F 18/241 |

OTHER PUBLICATIONS

Song Wang et al., "Exploring the mechanism of crashes with automated vehicles using statistical modeling approaches", PLoS ONE 14(3): e0214550, Mar. 28, 2019, 16 pages; https://doi.org/10.1371/journal.pone.0214550.

Faisal Riaz et al., "Towards Social Autonomous Vehicles: Efficient Collision Avoidance Scheme Using Richardson's Arms Race Model", PLoS ONE 12(10): e0186103, Oct. 17, 2017, 22 pages; https://doi.org/10.1371/journal.pone.0186103.

Alan J. Hamlet et al., "A 'Cognitive Driving Framework' for Collision Avoidance in Autonomous Vehicles", (IJACSA) International Journal of Advanced Computer Science and Applications, vol. 6, No. 5, Oct. 2015, 8 pages.

* cited by examiner

US 12,086,511 B2

COLLISION FILTERING FOR AUTONOMOUS VEHICLE SIMULATIONS

CROSS REFERENCE TO RELATED APPLICATION

This application claims priority to U.S. Provisional Patent Application No. 62/942,484, titled "Methods and Apparatus for Collision Filtering," filed Dec. 2, 2019; and U.S. Provisional Patent Application No. 62/945,421, titled "Methods and Apparatus for Collision Filtering Using Information on False Positives," filed Dec. 9, 2019. The entirety of each of the foregoing applications is hereby incorporated herein by reference.

TECHNICAL FIELD

The disclosure relates generally to simulating behaviors of autonomous vehicles.

BACKGROUND

The handling and delivery of goods and services using autonomous vehicles will improve society, e.g., by allowing people to engage in productive work while waiting for an autonomous vehicle to deliver goods rather than spending time procuring the goods. As the use of autonomous vehicles is growing, the ability to operate the autonomous vehicles safely is becoming more important.

Simulations are an integral part of allowing autonomous vehicles to operate safely. Simulations provide a mechanism for testing and validating different behaviors of autonomous vehicles in a variety of different conditions and environments. For example, simulations can provide insight into the effects of the behaviors on the autonomous vehicles and/or other vehicles or other agents before the behaviors are implemented in a real world environment.

DESCRIPTION OF EXAMPLE EMBODIMENTS

Overview

Figure 1:
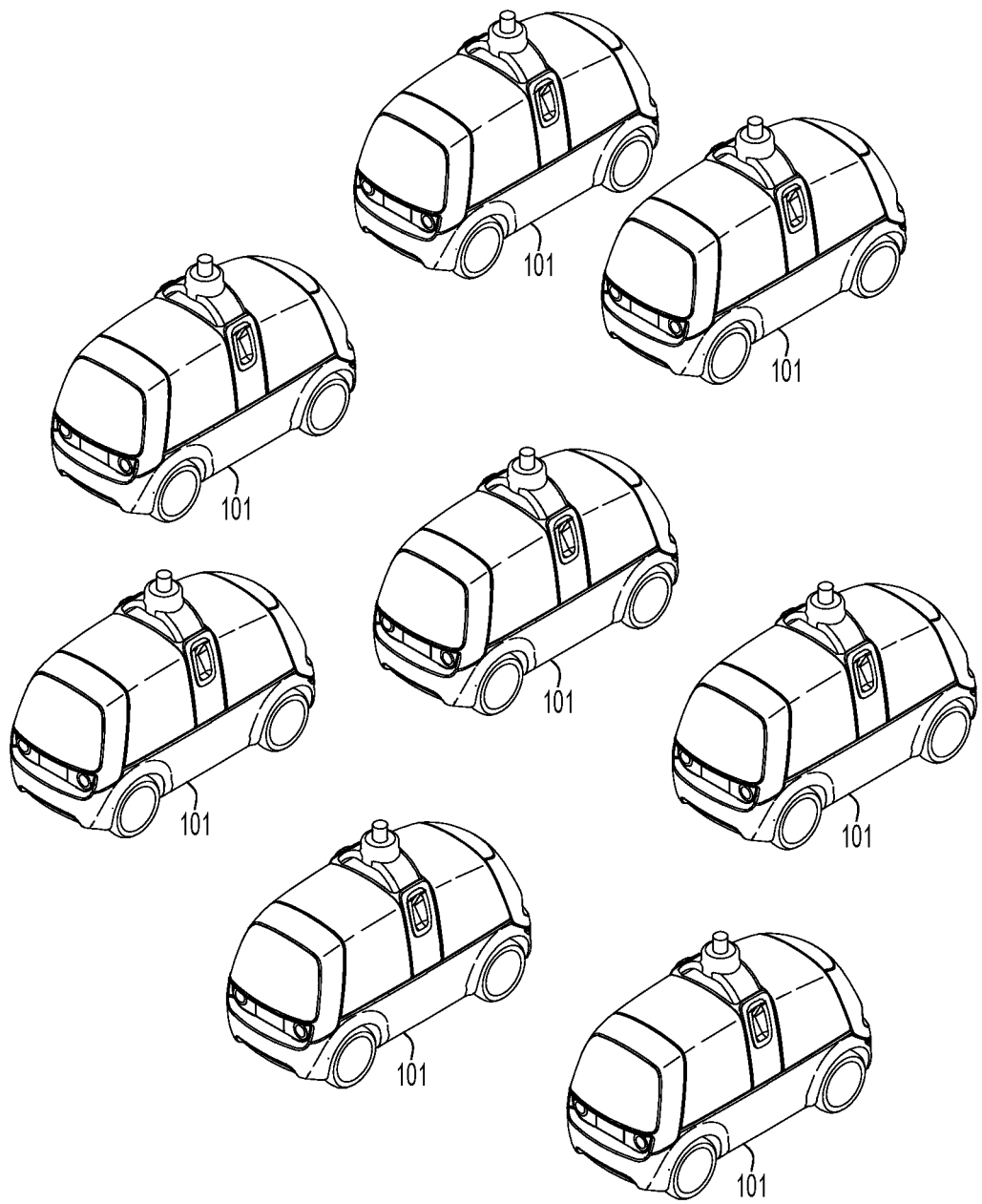
FIG. 1 is a diagram of an autonomous vehicle fleet, according to an example embodiment.

In one embodiment, a simulation system can be configured to identify a simulated collision involving a simulated autonomous vehicle and a simulated agent representing an obstacle with which the simulated autonomous vehicle may collide. For example, the simulated collision can be simulated based on logged data from a real-world autonomous vehicle. The simulation system can classify the simulated collision as unrealistic or realistic. For example, classification can involve considering a nature of the simulated agent (including, e.g., whether the simulated agent is a drivable obstacle), a nature of the collision, whether the collision is avoidable through an evasive maneuver, whether the collision is similar to a known false positive, and/or input from a human operator.

The simulation system can filter the simulated collision from participating in a collision triage analysis in response to classifying the simulated collision as an unrealistic simulated collision. For example, the collision triage analysis can include an analysis of software and/or data associated with the simulated collision to identify a root cause of the simulated collision. Modified software may be created for, and/or provided to, at least one real-world autonomous vehicle based on the collision triage analysis.

Example Embodiments

Simulations provide a mechanism for testing and validating different behaviors of autonomous vehicles. For example, a simulation can provide a software-based environment in which effects of the behaviors can be virtualized and evaluated before the behaviors are implemented in a real world environment. The simulations can include simulated objects and conditions that mimic the real world environment. For example, the simulations can include simulated roads, parking lots, sidewalks, curbs, steps, road markings, traffic lights, traffic signs, cones, construction markers, buildings, trees, bushes, lawns, steps, fences, and other infrastructure elements; simulated vehicles, cyclists, pedestrians, animals, and other actors; simulated rain, wind, fog, sleet, snow, hail, dust, bugs, leaves, exhaust from other vehicles, water from sprinklers, and other weather and environmental elements; and/or simulated garbage bins, trash, and other objects. These features may be included in the simulation, for example, based on logged data from one or more real-world autonomous vehicles. In addition, or in the alternative, at least certain of the features may be fabricated for the simulation without reference to logged data.

A simulation of an autonomous vehicle can sometimes result in a simulated collision involving the autonomous vehicle and one or more other agents. An "agent" can include any obstacle (animate or inanimate) with which an autonomous vehicle could collide, such as an infrastructure element, an actor, a weather/environmental element, and/or another object in the simulation environment. For example, a simulation could result in a simulated collision between a simulated autonomous vehicle and another simulated vehicle (which may or may not be autonomous).

Simulated collisions may be classified as "realistic" or "unrealistic." A "realistic" simulated collision is a simulated collision that is likely to occur as an actionable collision in the real world, while an "unrealistic" simulated collision is a simulated collision that is unlikely to occur as an actionable collision in the real world. An "actionable" collision is a collision that is unacceptable or for which there is otherwise a desire to avoid the collision. For example, a simulated collision may be realistic in the sense that it could genuinely take place in the real world but considered an unrealistic simulated collision if the simulated collision would be acceptable in the real world.

Many simulated collisions in simulations using logged (i.e., historical) data have been observed to be unrealistic simulated collisions because agents colliding with the simulated autonomous vehicles are not configured to react to new (unlogged) behaviors of the autonomous vehicles in a manner that a real-world agent would. A real-world agent might, for example, take an evasive action to avoid the collision. Simulated collisions also may be unrealistic simulated collisions for other reasons, including, for example, because the colliding agent is a drivable obstacle, like dust, exhaust, water, etc., and/or because a nature of the simulated collision is unrealistic in the real world.

Simulated collisions are typically triaged through a collision triage analysis. The collision triage analysis can involve, e.g., a detailed analysis of the simulated collision to confirm whether the simulated collision is actually realistic and/or to determine and address a root cause for the simulated collision. For example, collision triage analysis can involve analysis, and/or modification of, software and/or data associated with the simulated collision. Modified software may be created for, and/or provided to, at least one real-world autonomous vehicle based on the analysis. Collision triage analysis is generally time consuming and resource intensive.

In an example embodiment, a simulation system is configured to classify simulated collisions as unrealistic simulated collisions or realistic simulated collisions and filter unrealistic simulated collisions from participating in a collision triage analysis. For example, classification can involve considering features of the simulated autonomous vehicle and/or simulated agent (including, e.g., whether the simulated agent is a drivable obstacle), a nature of the collision, whether the collision is avoidable through an evasive maneuver, whether the collision is similar to a known false positive, and/or input from a human operator. By effectively screening out unrealistic simulated collisions before an in-depth collision triage analysis, the amount of time spent triaging simulated collisions may be significantly reduced. For example, detailed collision triage analysis may be essentially limited only to simulated collisions that are likely to constitute realistic (actionable) collisions in the real world. Thus, the overall simulation process, including the process of triaging simulated collisions, may be made more efficient.

Example embodiments that may be used to implement the features and functionality of this disclosure will now be described with more particular reference to the accompanying figures. When used to describe a range of dimensions and/or other characteristics (e.g., time, distance, length, etc.) of an element, operations, conditions, etc. the phrase "between X and Y" represents a range that includes X and Y. Similarly, when used herein, the term "approximately" and terms of its family (such as "approximate", etc.) should be understood as indicating values very near to those which accompany the aforementioned term. That is to say, a deviation within reasonable limits from an exact value should be accepted because a skilled person in the art will understand that such a deviation from the values indicated is inevitable due to measurement inaccuracies, etc. The same applies to the terms "about" and "around" and "substantially". Similarly, when used herein, the term "comprises" and its derivations (such as "comprising", etc.) should not be understood in an excluding sense, that is, these terms should not be interpreted as excluding the possibility that what is described and defined may include further elements, steps, etc. Further, each example embodiment is described herein as illustrative and is not to be construed as a preferred or advantageous embodiment, but rather as one example or illustration of a possible embodiment.

Referring initially to FIG. 1, an autonomous vehicle fleet 100 will be described in accordance with an example embodiment. The autonomous vehicle fleet 100 includes a plurality of autonomous vehicles 101. Each autonomous vehicle 101 is a manned or unmanned mobile machine configured to transport people, cargo, or other items, whether on land or water, air, or another surface, such as a car, wagon, van, tricycle, truck, bus, trailer, train, tram, ship, boat, ferry, drove, hovercraft, aircraft, spaceship, etc.

Each autonomous vehicle 101 may be fully or partially autonomous such that the vehicle can travel in a controlled manner for a period of time without human intervention. For example, a vehicle may be "fully autonomous" if it is configured to be driven without any assistance from a human operator, whether within the vehicle or remote from the vehicle, while a vehicle may be "semi-autonomous" if it uses some level of human interaction in controlling the operation of the vehicle, whether through remote control by, or remote assistance from, a human operator, or local control/assistance within the vehicle by a human operator. A vehicle may be "non-autonomous" if it is driven by a human operator located within the vehicle. A "fully autonomous vehicle" may have no human occupant or it may have one or more human occupants that are not involved with the operation of the vehicle; they may simply be passengers in the vehicle.

In an example embodiment, each autonomous vehicle 101 may be configured to switch from a fully autonomous mode to a semi-autonomous mode, and vice versa. Each autonomous vehicle 101 also may be configured to switch between a non-autonomous mode and one or both of the fully autonomous mode and the semi-autonomous mode.

The fleet 100 may be generally arranged to achieve a common or collective objective. For example, the autonomous vehicles 101 may be generally arranged to transport and/or deliver people, cargo, and/or other items. A fleet management system (not shown) can, among other things, coordinate dispatching of the autonomous vehicles 101 for purposes of transporting, delivering, and/or retrieving goods and/or services. The fleet 100 can operate in an unstructured open environment or a closed environment.

Figure 2:
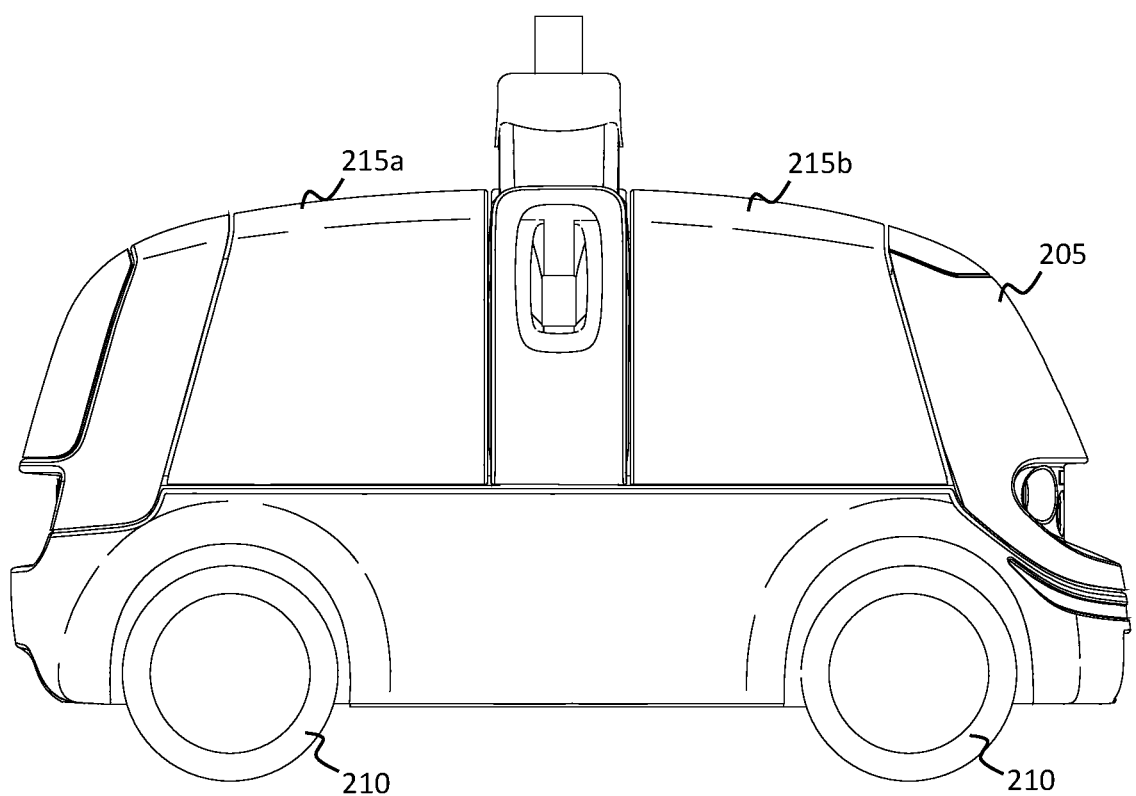
FIG. 2 is a diagram of a side of an autonomous vehicle, according to an example embodiment.

FIG. 2 is a diagram of a side of an autonomous vehicle 101, according to an example embodiment. The autonomous vehicle 101 includes a body 205 configured to be conveyed by wheels 210 and/or one or more other conveyance mechanisms. In an example embodiment, the autonomous vehicle 101 is relatively narrow (e.g., approximately two to approximately five feet wide), with a relatively low mass and low center of gravity for stability.

The autonomous vehicle 101 may be arranged to have a moderate working speed or velocity range of between approximately one and approximately forty-five miles per hour ("mph"), e.g., approximately twenty-five mph, to accommodate inner-city and residential driving speeds. In addition, the autonomous vehicle 101 may have a substantially maximum speed or velocity in a range of between approximately thirty and approximately ninety mph, which may accommodate, e.g., high speed, intrastate or interstate driving. As would be recognized by a person of ordinary skill in the art, the vehicle size, configuration, and speed/velocity ranges presented herein are illustrative and should not be construed as being limiting in any way.

The autonomous vehicle 101 includes multiple compartments (e.g., compartments 215a and 215b), which may be assignable to one or more entities, such as one or more customers, retailers, and/or vendors. The compartments are generally arranged to contain cargo and/or other items. In an example embodiment, one or more of the compartments may be secure compartments. The compartments 215a and 215b may have different capabilities, such as refrigeration, insulation, etc., as appropriate. It should be appreciated that the number, size, and configuration of the compartments may vary. For example, while two compartments (215a, 215b) are shown, the autonomous vehicle 101 may include more than two or less than two (e.g., zero or one) compartments.

Figure 3:
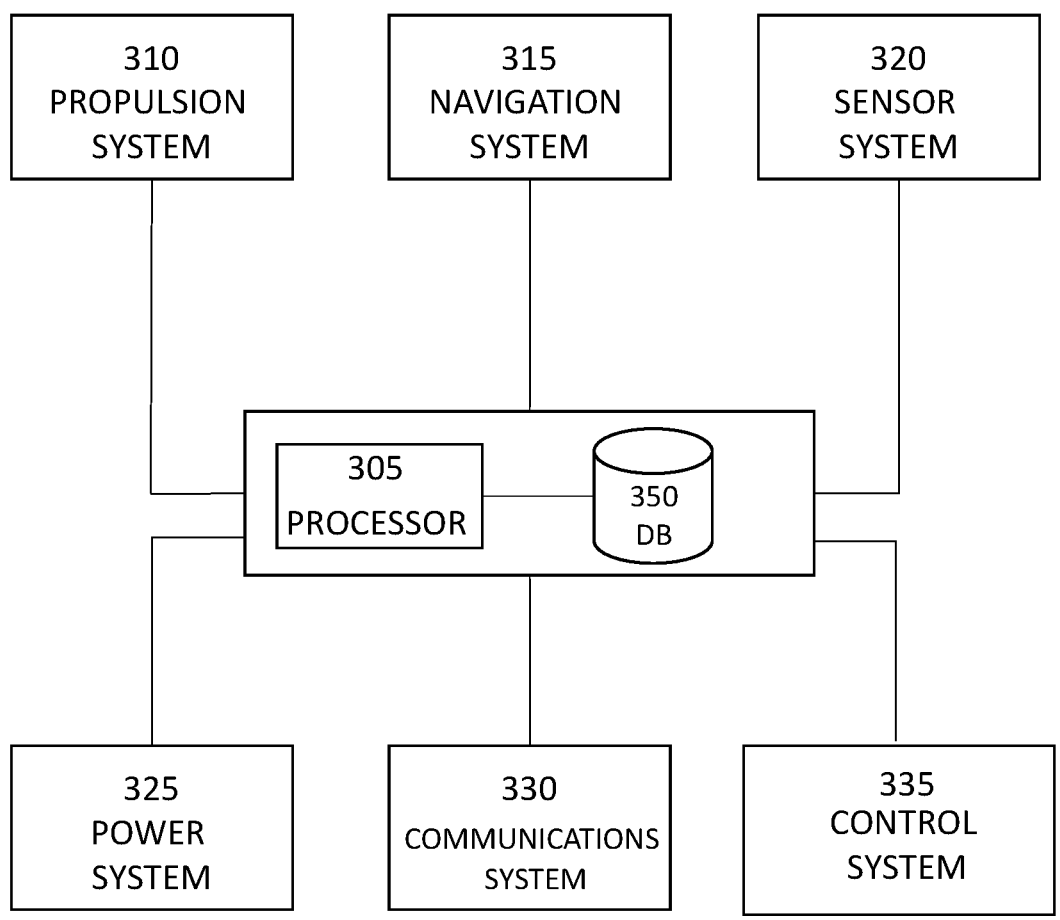
FIG. 3 is a block diagram representation of functional components of an autonomous vehicle, according to an example embodiment.

FIG. 3 is a block diagram representation of certain functional components of the autonomous vehicle 101, according to an example embodiment. With reference to FIGS. 2 and 3, the autonomous vehicle 101 includes a processor 305, which is operatively coupled to, and configured to send instructions to, and receive instructions from or for, a database 350 and various systems of the autonomous vehicle 101, including: a propulsion system 310, a navigation system 315, a sensor system 320, a power system 325, a communications system 330, and a control system 335. The processor 305, database 350, and systems are operatively coupled to, or integrated with, the body 205 (FIG. 2) of the autonomous vehicle 101 and generally cooperate to operate the autonomous vehicle 101.

The propulsion system 310 includes components configured to drive (e.g., move or otherwise convey) the autonomous vehicle 101. For example, the propulsion system 310 can include an engine, wheels, steering, and a braking system, which cooperate to drive the autonomous vehicle 101. In an example embodiment, the engine may be a gas engine, a turbine engine, an electric motor, and/or a hybrid gas/electric engine. As would be appreciated by a person of ordinary skill in the art, the propulsion system 310 may include additional or different components suitable or desirable for conveying an object, which are now known or hereinafter developed, such as one or more axles, treads, wings, rotors, blowers, rockets, propellers, and/or other components.

Although the autonomous vehicle 101 shown in FIGS. 1 and 2 has a 4-wheeled, 2-axle automotive configuration, this configuration is illustrative and should not be construed as being limiting in any way. For example, the autonomous vehicle 101 may have more or less than 4 wheels, more or less than 2 axles, and a non-automotive configuration in an alternative example embodiment. For example, the vehicle may be configured for travel other than land travel, such as water travel, hover travel, and/or air travel without departing from the spirit or the scope of the present disclosure.

The navigation system 315 can be configured to control the propulsion system 310 and/or provide guidance to an operator associated with the autonomous vehicle 101 to navigate the autonomous vehicle 101 through paths and/or within unstructured open or closed environments. The navigation system 315 may include, e.g., digital maps, street view photographs, and/or a global positioning system ("GPS") point. For example, the navigation system 315 may cause the autonomous vehicle 101 to navigate through an environment based on information in the digital maps and information from sensors included in the sensor system 320.

The sensor system 320 includes one or more sensors configured to view and/or monitor conditions on or around the autonomous vehicle 101. For example, the sensors can ascertain when there are objects near the autonomous vehicle 101 to enable the autonomous vehicle 101 to safely guide the autonomous vehicle 101 (via the navigation system 315) around the objects. The sensors may include, e.g., cameras (e.g., running at a high frame rate, akin to video), light detection and ranging ("LiDAR"), radar, ultrasonic sensors, microphones, altimeters, etc. In an example embodiment, the sensor system 320 includes propulsion system sensors that monitor drive mechanism performance, drive train performance, and/or power system levels. The sensor system 320 also may include one or more microphones configured to detect sounds external to the autonomous vehicle 101, such as a siren from an emergency vehicle requesting a right-of-way, a honk from another vehicle, etc.

The power system 325 is arranged to provide power to the autonomous vehicle 101. Power may be provided as electrical power, gas power, or any other suitable power, e.g., solar power or battery power. In an example embodiment, the power system 325 may include a main power source and an auxiliary power source configured to power various components of the autonomous vehicle 101 and/or to generally provide power to the autonomous vehicle 101 when the main power source does not have the capacity to provide sufficient power.

The communications system 330 is arranged to enable communication between the autonomous vehicle 101 and an external person or device. For example, the communications system 330 can be configured to enable communication via wireless local area network (WLAN) connectivity (e.g., cellular) or any other wireless or mobile communication capability now known or hereinafter developed. In an example embodiment, the communications system 330 can communicate wirelessly with a fleet management system (not shown in FIG. 3), which is arranged to control and/or assist the autonomous vehicle 101 from a location remote from the autonomous vehicle 101. For example, the communications system 330 can generally obtain or receive data, store the data, and transmit or provide the data to the fleet management system and/or to one or more other vehicles within a fleet. The data may include, but is not limited to, information relating to scheduled requests or orders, information relating to on-demand requests or orders, information relating to a need for the autonomous vehicle 101 to reposition itself, e.g., in response to an anticipated demand, information regarding an operational or mechanical need or behavior of the autonomous vehicle 101, information regarding an upcoming construction zone or other hazard in the path of the autonomous vehicle 101, etc.

In an example embodiment, the control system 335 may cooperate with the processor 305 and each of the other systems in the autonomous vehicle 101, including the propulsion system 310, the navigation system 315, the sensor system 320, the power system 325, and the communications system 330, to control operation of the autonomous vehicle 101. For example, the control system 335 may cooperate with the processor 305 and the other systems to determine where the autonomous vehicle 101 may safely travel and to detect (e.g., based on data from the sensor system 320 and/or from an external system (not shown) communicating with the autonomous vehicle 101 via the communications system 330), and navigate around, objects in a vicinity around the autonomous vehicle 101. In other words, the control system 335 may cooperate with the processor 305 and other systems to effectively determine and facilitate what the autonomous vehicle 101 may do within its immediate surroundings. For example, the control system 335 in cooperation with the processor 305 may essentially control the power system 325 and/or the navigation system 315 as part of driving or conveying the autonomous vehicle 101. In this sense, the control system 335 manages autonomous control of the autonomous vehicle 101. Additionally, the control system 335 may cooperate with the processor 305 and communications system 330 to provide data to, or obtain data from, other vehicles, a fleet management server, a GPS, a personal computer, a teleoperations system, a smartphone, or any other computing device via the communications system 330.

The database 350 includes data stores or storage structures (e.g., files, databases, data structures, data or other repositories, etc.) that are configured to store information. In an example embodiment, the database 350 is configured to store information regarding the autonomous vehicle 101, jobs/tasks assigned to, and/or performed by, the autonomous vehicle 101, software for the autonomous vehicle 101, etc. For example, the database 350 can include logged information collected by one or more of the systems of the autonomous vehicle 101 during operation of the autonomous vehicle 101. The logged information can be used, e.g., by a fleet management system to enable simulations for the autonomous vehicle 101, one or more other autonomous vehicles 101 in a fleet of autonomous vehicles, and/or one or more other systems or devices. For example, the autonomous vehicle 101 can provide data from the database 350 to the fleet management system through a manual download at a fleet management location or via electronic communication means, e.g., through one or more communications of the communications system 330. Though depicted in FIG. 3 as being located within the vehicle 101, it should be recognized that the database 350 could be located remote from the vehicle 101, e.g., in a cloud or data center solution, in alternative example embodiments.

Figure 4:
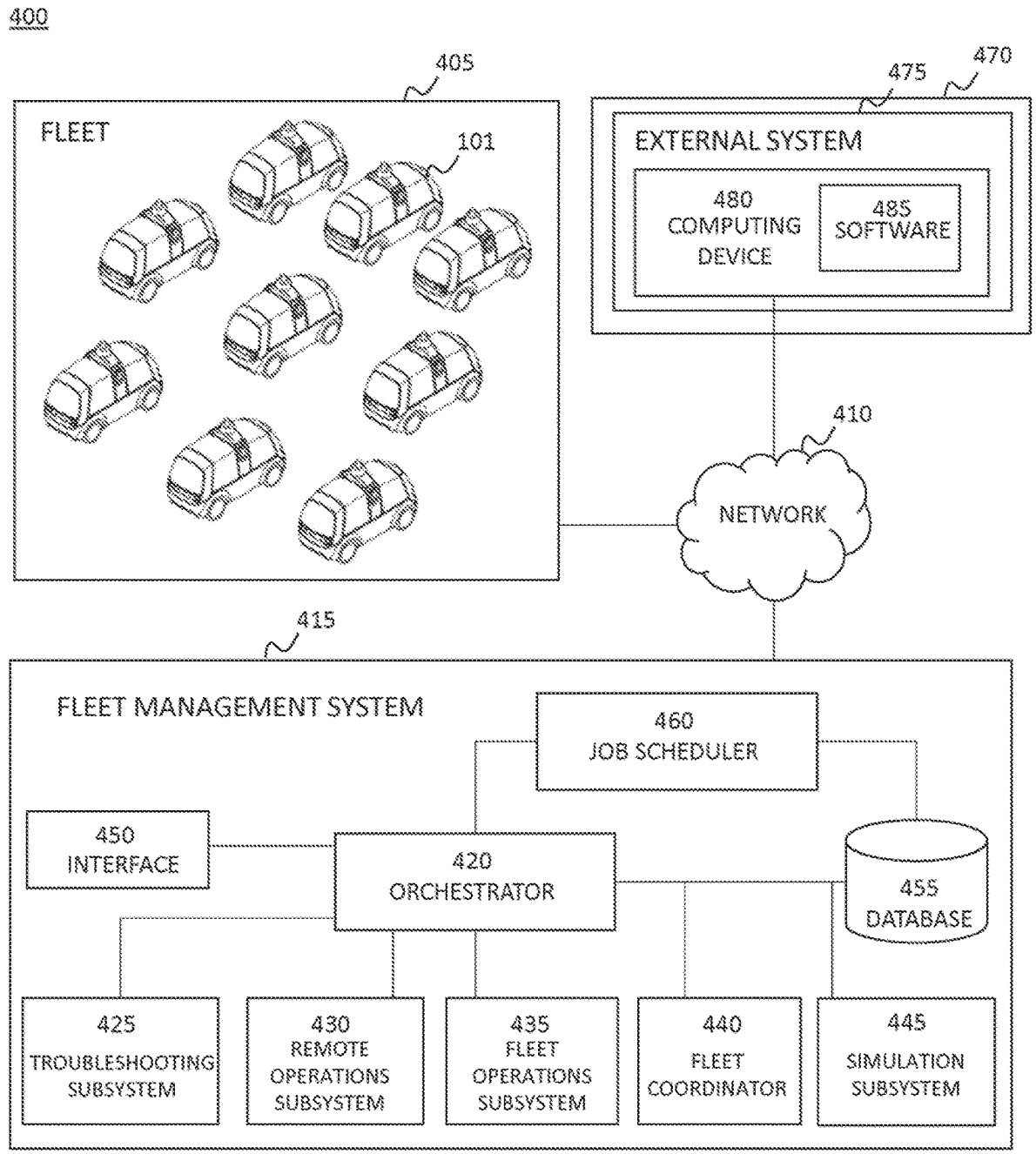
FIG. 4 is a block diagram representation of functional components of an interconnected autonomous vehicle fleet ecosystem in which techniques for collision filtering for autonomous vehicle simulations may be implemented, according to an example embodiment.

FIG. 4 is a block diagram representation of functional components of an interconnected autonomous vehicle fleet ecosystem 400, according to an example embodiment. The ecosystem 400 includes an autonomous vehicle fleet 405 including a plurality of autonomous vehicles 101. The autonomous vehicles 101 in the autonomous vehicle fleet 405 are interconnected with one another, a fleet management system 415, and at least one system external to the fleet management system (an "external system") 475 via at least one network 410. The network 410 can include any communications medium for transmitting information between two or more computing devices. For example, the network 410 can include a wireless local area network (WLAN) capability (e.g., cellular) or any other wireless or mobile communication capability now known or hereinafter developed.

The fleet management system 415 includes an orchestrator 420, which is configured to coordinate operations of the ecosystem 400, including remotely coordinating operations of the autonomous vehicle fleet 405. The orchestrator 420 is operatively coupled to, and configured to send instructions to, and receive instructions from or for, various subsystems of the fleet management system 415, including: a troubleshooting subsystem 425, a remote operations subsystem 430, a fleet operations subsystem 435, a fleet coordinator 440, a simulation subsystem 445, an interface 450, and a job scheduler 460.

The job scheduler 460 is configured to assign jobs to the autonomous vehicles 101 based on a variety of considerations, including, e.g., constraints for the autonomous vehicles 101 and any human operators and/or physical infrastructure required to compete each job. A "job" is any action to be completed by, or with, the autonomous vehicle 101. Certain jobs may be completed fully autonomously by the autonomous vehicle 101, while other jobs may require at least some involvement by a human. Each job may include one or more tasks or a series of one or more tasks. For example, a job of transporting a package from a first location to a second location may include several tasks, including (among other things): starting the vehicle, procuring the package, identifying a preferred path from the first location to the second location, moving the vehicle along the preferred path to the second location, and providing the package to a designated recipient.

Each job may involve activities that are relevant to fleet operations, vehicle operations, or other matters. For example, certain jobs can include support and maintenance activities, like completing a calibration, charging a battery, updating a map or other software, cleaning an interior or exterior of the vehicle, troubleshooting a problem, etc. As would be recognized by a person of ordinary skill in the art, the jobs and tasks described herein are illustrative and should not be construed as being limiting in any way. For example, job assignments may include considerations of route locations, route driving times, route distances, vehicle locations, vehicle ranges, vehicle charging statuses/needs, parking needs, vehicle storage capacities, capabilities, and/or configurations, relative job priorities, any associations between particular vehicles and particular job sites, etc.

In an example embodiment, the job scheduler 460 is configured to cooperate with the orchestrator 420 and other subsystems of the fleet management system 415 to create and/or change job assignments dynamically. For example, during job planning or execution, the job scheduler 460 may create and/or change job assignments to resolve issues as they arise or to increase operational efficiencies. The job scheduler 460 may operate autonomously or via input from one or more operators. For example, one or more operators may interact with the job scheduler 460 via a user interface provided by the job scheduler 460 to schedule jobs and assign them to autonomous vehicles 101.

A database 455 includes data stores or storage structures (e.g., files, databases, data structures, data or other repositories, etc.) that are configured to store information. In an example embodiment, the database 455 is configured to store information regarding various different types of potential jobs, tasks associated with the different types of potential jobs, software and associated information, patches, logs, etc. for operating the autonomous vehicles 101, known constraints for the autonomous vehicles 101, operators, and physical infrastructure, etc. For example, the job scheduler 460 may reference this information when assigning jobs. The job scheduler 460 also can store in the database 455 information regarding assigned jobs, such as relative priorities of the jobs, an expected start time and completion time for each job and task thereof, an identity of each vehicle/system/operator associated with each job/task, and any software or other resources required to complete each job/task. Though depicted in FIG. 4 as being located within the fleet management system 415, it should be recognized that the database 455 could be located remote from the fleet management system 415, e.g., in a cloud or data center solution, in alternative example embodiments.

The orchestrator 420 is configured to monitor completion of assigned jobs and coordinate completion of tasks by the autonomous vehicles 101 and the other subsystems of the fleet management system 415 in order to enable completion of the assigned jobs. The orchestrator 420 can identify, for each job (or type of job), a plurality of tasks to be completed. For example, the database 455 can include, and the orchestrator 420 can read, consider, and where appropriate, provide, or cause to be provided, to the autonomous vehicles 101 or one or more systems internal or external to the fleet management system 415, information indicating tasks to be performed for each job (or type of job), information indicating each subsystem (or the vehicle, if applicable) responsible for completing and/or coordinating each task, any software or other resources required to complete each job/task, and any other information or materials necessary or desirable for facilitating completion of the tasks.

The troubleshooting subsystem 425 is configured to obtain information from the autonomous vehicles 101 that indicates whether any of the autonomous vehicles 101 have issues, e.g., health issues, that are affecting, or are about to affect, the ability of the autonomous vehicles 101 to function. For example, the autonomous vehicles 101 may be configured to self-report issues or may be configured to provide general information from which the troubleshooting subsystem 425 may detect issues. The troubleshooting subsystem 425 can process information from the autonomous vehicles 101 to diagnose and address issues. In an example embodiment, the troubleshooting subsystem 425 may be configured to diagnose and address certain issues fully autonomously and to escalate certain other issues for input and/or action by a human operator via a user interface provided by the troubleshooting subsystem 425. For example, the troubleshooting subsystem 425 may be configured to diagnose and address certain predefined health issues using information in the database 455. The troubleshooting subsystem 425 also may be configured to coordinate with the orchestrator 420 to cause one or more rescue or replacement vehicles to be dispatched as needed.

The troubleshooting subsystem 425 may operate autonomously or via input from one or more operators. For example, one or more operators may interact with the troubleshooting subsystem 425 via a user interface provided by the troubleshooting subsystem 425 to view, update, and take action with respect to vehicle health information.

The remote operations subsystem 430 is configured to provide remote assistance to the autonomous vehicles 101. In particular, the remote operations subsystem 430 includes a vehicle control system, which is configured to effectively seize control of the autonomous vehicle 101, e.g., through a teleoperations or remote control mechanism, and a vehicle assistance system, which is configured to provide assistance (e.g., supervision and/or input) to the autonomous vehicles 101 without taking control of the autonomous vehicles 101. Though described herein as distinct systems, the vehicle control system and vehicle assistance system may share certain operational and logical components. For example, the vehicle control system and vehicle assistance system can share certain communication/processing equipment and a human operation station through which a human operator can operate, remotely control, and remotely assist an autonomous vehicle 101. The human operation station can include, for example, a driver seat, a steering wheel, brake and acceleration pedals, a gear shifter, and a visual interface that is configured to allow a human operator to view an environment in which an autonomous vehicle 101 is driving. In addition, or in the alternative, the human operation station can include a handheld or other remote controlled device through which a human can drive or otherwise control or assist an autonomous vehicle 101.

In an example embodiment, the remote operations subsystem 430 may take control over, and/or provide assistance to, an autonomous vehicle 101 in response to a request for such action by the autonomous vehicle 101 or based on a behavior or situation observed by the fleet management system 415. For example, the orchestrator 420 may cause the remote operations subsystem 430 to take control over, and/or provide assistance to, the autonomous vehicle 101 in response to a determination that the autonomous vehicle 101 is unable to safely and/or effectively complete a particular job or task autonomously. In an example embodiment, the orchestrator 420 may coordinate operations between the remote operations subsystem 430, the troubleshooting subsystem 425, the fleet operations subsystem 435, and the fleet coordinator 440 to effectively decommission and recover autonomous vehicles 101 in need of service.

The fleet operations subsystem 435 is configured to coordinate maintenance and servicing of autonomous vehicles 101 in the fleet 405. For example, the fleet operations subsystem 435 can schedule and coordinate planned (e.g., routine) and unplanned (e.g., emergency) servicing, cleaning, charging, and other maintenance activities. The fleet operations subsystem 435 also may be configured to remotely start the autonomous vehicles 101 from a dormant state, e.g., through a "one-click" or other remote startup operation. For example, the fleet operations subsystem 435 may determine, based on health and/or configuration information for an autonomous vehicle 101 and/or a job associated with the autonomous vehicle 101, whether the autonomous vehicle 101 is ready to operate.

The fleet operations subsystem 435 may operate autonomously or via input from one or more operators. For example, one or more operators may interact with the fleet operations subsystem 435 via a user interface provided by the fleet operations subsystem 435 to view, update, and take action with respect to maintenance and servicing information for the autonomous vehicles 101 and/or for groups of autonomous vehicles 101 within the fleet 405.

The fleet coordinator 440 is configured to oversee the general operations of the autonomous vehicles 101 in the fleet 405 and to coordinate, via the orchestrator 420, with the job scheduler 460 and other subsystems of the fleet management system 415 to make any necessary scheduling or job assignment adjustments. For example, the fleet coordinator 440 may cause one or more jobs from a first autonomous vehicle 101 to be reassigned to at least one other autonomous vehicle 101 if the first autonomous vehicle 101 is removed from service. The fleet coordinator 440 also may coordinate delivery of a new, replacement autonomous vehicle 101 if an autonomous vehicle 101 is recovered.

The fleet coordinator 440 may operate autonomously or via input from one or more operators. For example, one or more operators may interact with the fleet coordinator 440 via a user interface provided by the fleet coordinator 440 to view, update, and take action with respect to status, health, and job information for the autonomous vehicles 101 and/or for groups of autonomous vehicles 101 within the fleet 405.

The simulation subsystem 445 is configured to simulate autonomous vehicle operations in a virtual, simulation environment. For example, the simulation subsystem 445 can include computer hardware, software, logic, and/or other mechanisms configured to simulate behaviors by one or more simulated autonomous vehicles in the simulation environment to determine effects of those behaviors on the simulated autonomous vehicles and/or one or more other agents. The simulated autonomous vehicles and agents can be configured to act (and potentially, though not necessarily, look) like regular autonomous vehicles 101 and agents, respectively, operating in the real world. For example, the simulation subsystem 445 can include features and/or actions of at least certain of the items in the simulation environment based on logged data from one or more real-world autonomous vehicles 101. In addition, or in the alternative, at least certain of the features may be fabricated for the simulation without reference to logged data.

The simulated behaviors can include any actions, conduct, configurations, and/or other functions/characteristics of an autonomous vehicle 101. For example, simulated behaviors may include different approaches to turning at an intersection, merging into traffic, timing an acceleration, deceleration, right of way, or other action, reacting (or not reacting) to fog, exhaust, rodents, or other potentially drivable (or not drivable) obstacles, etc. Each simulated behavior may be implemented via software, which may or may not be provisioned to autonomous vehicles 101 in the real world. For example, the simulation subsystem 445 can test software for a particular behavior by simulating the behavior to determine performance, safety, and other characteristics of the behavior, before the software is provisioned for use by one or more autonomous vehicles 101 in the real world.

The software can be modified as appropriate based on an outcome of the simulation. For example, if a simulated behavior results in one or more realistic simulated collisions involving the simulated autonomous vehicle, the simulation subsystem 445 may be configured to (e.g., in cooperation with one or more other subsystems of the fleet management system 415 or another system internal or external thereto) modify the software to mitigate risk of the collision in future simulations and/or real-world applications of the software. Modification of the software may, for example, be part of a comprehensive collision triage analysis by the simulation subsystem 445 to assess and refine the software (and/or data associated with the software, simulation, and/or autonomous vehicles 101) in response to a simulated collision.

In an example embodiment, the simulation subsystem 445 can be configured to classify any simulated collisions as unrealistic simulated collisions or realistic simulated collisions and filter unrealistic simulated collisions from participating in the collision triage analysis. For example, the simulation subsystem 445 can be configured to include only simulated collisions classified as realistic simulated collisions in the collision triage analysis. Classification can involve, e.g., considering a nature of the simulated agent (including, e.g., whether the simulated agent is a drivable obstacle), a nature of the simulated collision, whether the simulated collision is avoidable through an evasive maneuver, whether the simulated collision is similar to a known false positive, and/or input from a human operator.

The simulation subsystem 445 may operate autonomously or via input from one or more operators. For example, one or more operators may interact with the simulation subsystem 445 via a user interface provided by the simulation subsystem 445 to view, customize, analyze, interact with, and/or take action with respect to, simulations and/or associated software, data, etc. The simulation subsystem 445 is described in more detail below, with reference to FIG. 5.

The interface 450 is configured to enable interactions between the fleet management system 415 and at least one external system 475 of an entity 470. The entity 470 may be a customer, partner, or other person or company/enterprise that receives, provides, or facilitates the provision of goods or services in connection with the autonomous vehicles 101. In an example embodiment, a computing device 480 of the entity 470 can view, update, and take action with respect to autonomous vehicles 101 and/or jobs/tasks associated with the entity 470 via the interface 450. For example, the interface 450 can provide a graphical user interface through which a customer, partner, or other entity 470 can view current status information regarding a pending or completed job, a particular autonomous vehicle 101 or group of autonomous vehicles 101, etc.

In addition to, or in lieu of, providing a user interface, the interface 450 can communicate with the computing device 480 to provide and/or collect information associated with the autonomous vehicles 101, jobs/tasks, etc. For example, the interface 450 can receive and answer questions from an operator of the computing device 480. The interface 450 may operate autonomously or via input from one or more operators of the fleet management system 415. For example, the interface 450 may provide a user interface through which one or more operators may interact to communicate with the external system 475.

Each computing device 480 includes a computer or processing system, such as a desktop, laptop, tablet, phone, or other mobile or non-mobile device. Each computing device 480 may include, for example, one or more types of displays (e.g., a screen or monitor) and input devices (e.g., a keyboard, mouse, voice recognition, etc.) to enter and/or view information. Each computing device 480 includes software 485, such as an internet browser or software application, through which the computing device 480 communicates with the interface 450.

Figure 5:
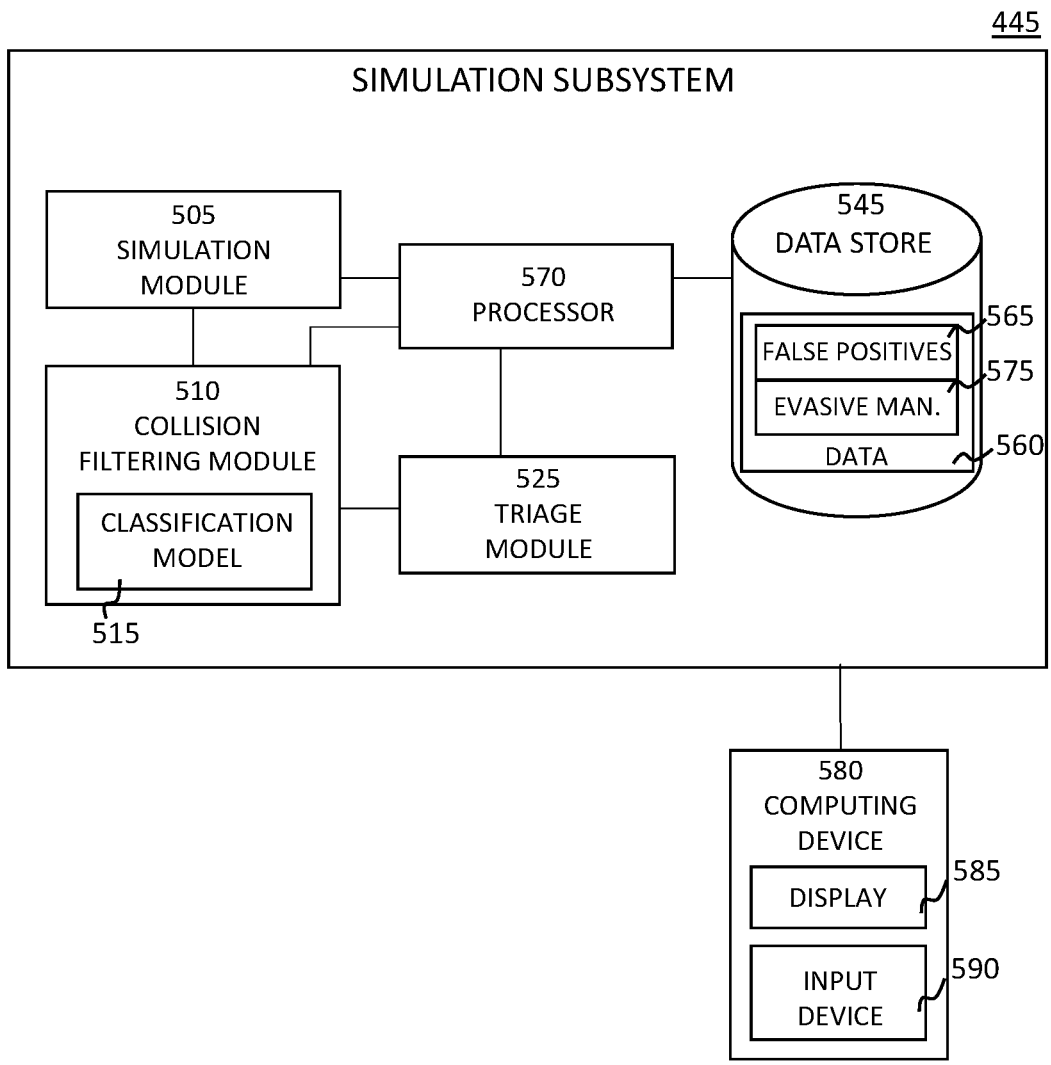
FIG. 5 is a block diagram representation of functional components of a simulation subsystem and computing device, according to an example embodiment.

Turning to FIG. 5, the simulation subsystem 445 is now described in more detail. The simulation subsystem 445 includes a processor 570, which is operatively coupled to, and configured to send instructions to, and receive instructions from or for, a simulation module 505, a collision filtering module 510, a triage module 525, and a data store 545.

The simulation module 505 is configured to simulate autonomous vehicle operations in a simulation environment. The simulation environment is a virtual environment in which a subject (simulated) vehicle (sometimes called an "ego" vehicle) can operate. The subject vehicle can be configured to act (and potentially, though not necessarily, look) like a regular vehicle that operates in the real world. For example, the subject vehicle can be configured to act and/or look like the autonomous vehicle 101 described above in connection with FIGS. 1-3. In particular, the subject vehicle may be configured to have an autonomy software stack configured to produce behaviors by the subject vehicle in the simulation environment that are in line with behaviors an autonomous vehicle would exhibit in the real world. In an example embodiment, the simulation module 505 can test different autonomy software stacks or other software in the simulation environment before the software is provisioned to any autonomous vehicles in the real world.

The simulation environment can include simulated objects and conditions that mimic a real world environment. For example, the simulation environment can include simulated roads, parking lots, sidewalks, curbs, steps, road markings, traffic lights, traffic signs, cones, construction markers, buildings, trees, bushes, lawns, steps, fences, and other infrastructure elements; simulated vehicles, cyclists, pedestrians, animals, and other actors; simulated rain, wind, fog, sleet, snow, hail, dust, bugs, leaves, exhaust from other vehicles, water from sprinklers, and other weather and environmental elements; and/or simulated garbage bins, trash, and other objects. Each of these simulated items may be configured to behave (and potentially, though not necessarily, look) like a corresponding item in the real world. For example, the simulation module 505 can include features and/or actions of at least certain of the items in the simulation environment based on logged data from one or more real-world autonomous vehicles. In addition, or in the alternative, at least certain of the features may be fabricated for the simulation without reference to logged data.

A simulation of an autonomous vehicle can sometimes result in a simulated collision involving the autonomous vehicle and one or more other agents. Simulated collisions may be realistic simulated collisions or unrealistic simulated collisions. For example, simulated collisions in simulations using logged (i.e., historical) data may be unrealistic simulated collisions because agents colliding with the simulated autonomous vehicles are not configured to react to new (unlogged) behaviors of the autonomous vehicles in a manner that a real-world agent would. A real-world agent might, for example, take an evasive action to avoid the collision. Simulated collisions also may be unrealistic simulated collisions for other reasons, including, for example, because the colliding agent is a drivable obstacle, like dust, exhaust, water, etc., and/or because a nature of the collision is unrealistic in the real world.

The collision filtering module 510 is configured to assess simulated collisions to determine whether they are realistic simulated collisions or unrealistic simulated collisions. For example, the collision filtering module 510 can use (and/or include) one or more machine learning classification models 515 and/or other logic for classifying simulated collisions based on a variety of different considerations. The considerations can include, e.g., a nature of the simulated agent (including, e.g., whether the simulated agent is a drivable obstacle), a nature of the collision, whether the collision is avoidable through an evasive maneuver, whether the collision is similar to a known false positive, and/or input from a human operator. For example, the collision filtering module 510 can identify a point in time at which the subject simulated vehicle crossed into a path or trajectory of the simulated agent with which the simulated vehicle subsequently collided and then analyze the considerations with reference to size, speed, trajectory/direction, behavior, and/or other factors associated with the simulated vehicle and/or agent at or around that point in time.

In an example embodiment, the collision filtering module 510 can send information regarding any realistic simulated collisions to the triage module 525, which can be configured to perform a collision triage analysis. For example, the collision triage analysis can include a detailed analysis of the simulated collision to confirm whether the simulated collision is actually a realistic simulated collision and/or to determine and address a root cause for the simulated collision. The root cause analysis can involve, e.g., analysis, and/or modification of, the autonomy stack and/or other software and/or data associated with the simulated collision. For example, the triage module 525 may be configured to (e.g., in cooperation with one or more other systems or subsystems internal or external to the simulation subsystem 445) modify the software and/or data to mitigate risk of the collision in future simulations and/or real-world applications of the software. The triage module 525 (and/or one or more other systems or subsystems) may provide the modified software to one or more autonomous vehicles for use in the real world.

The collision filtering module 510 can be configured to filter/screen out any collisions classified as unrealistic simulated collisions from being sent to the triage module 525 and/or participating in a collision triage analysis. By effectively screening out unrealistic simulated collisions before an in-depth collision triage analysis, the amount of time spent triaging simulated collisions may be significantly reduced. For example, detailed collision triage analysis may be essentially limited only to simulated collisions that are likely to constitute actionable collisions in the real world.

The data store 545 includes data stores or storage structures (e.g., files, databases, data structures, data or other repositories, etc.) that are configured to store information. For example, the data store 545 can store data 560 related to simulations, including, e.g., software and data related to simulated vehicles, simulated agents, the simulation environment, and behaviors, features, and other characteristics of each of the foregoing. The data 560 also can include information regarding simulated collisions, including time, size, speed, trajectory/direction, behavior, and/or other information regarding the simulated vehicle, agent(s), environment, etc. The data 560 may be referenced, for example, by the simulation module 505, collision filtering module 510, and/or triage module 525, as appropriate, to create and manage simulations, classify simulated collisions, and analyze and respond to realistic simulated collisions.

In an example embodiment, the data 560 includes false positives data 565, which includes information regarding known false positives, i.e., simulated collisions that have previously been determined/confirmed to be unrealistic. For example, if the collision filtering module 510 and/or triage module 525 analyze a particular simulated collision and determine and/or confirm, as applicable, that the particular simulated collision is an unrealistic simulated collision, information regarding the particular simulated collision can be stored as false positives data 565 in the data store 545. The collision filtering module 510 and/or triage module 525 can reference this false positives data 565, for example, when determining whether a subsequent simulated collision is a realistic simulated collision or unrealistic simulated collision, e.g., by determining a degree of similarity between the subsequent simulated collision and the simulated collisions known to be false positives. For example, the collision filtering module 510 can include one or more machine learning models (e.g., the classification model 515 and/or another model) or other logic for determining the degree of similarity between the simulated collision data and the false positives data 565.

The logic can determine the degree of similarity, for example, by comparing, in a weighted or unweighted fashion, information regarding the simulated collision and the false positive simulated collisions, such as time, size, speed, trajectory/direction, behavior, and/or other information regarding the simulated vehicle, agent(s), environment, etc. The collision filtering module 510 can set, e.g., in the data store 545, a predetermined threshold value such that a simulated collision having a degree of similarity (or "similarity score") with false positives data 565 at or above the threshold value can be considered to be an unrealistic simulated collision, while a simulated collision having a similarity score (with respect to the false positives data 565) below the threshold value can be considered to be a realistic simulated collision (or at least not an unrealistic simulated collision on the basis of being similar to false positives data 565). As may be appreciated by a person of ordinary skill in the art, a higher threshold value may result in less simulated collisions being classified as unrealistic simulated collisions (at least on the basis of being similar to false positives data 565), while a lower threshold value may result in more simulated collisions being classified as unrealistic simulated collisions.

The data 560 also can include evasive maneuver data 575, which includes information regarding potential evasive maneuvers a simulated autonomous vehicle and/or agent can execute to avoid a simulated collision. For example, an evasive maneuver can include changing a speed and/or trajectory/direction of the simulated autonomous vehicle and/or agent, e.g., by swerving, turning, braking, speeding up, etc. The collision filtering module 510 can evaluate potential evasive maneuvers when determining whether a simulated collision is avoidable and, thus, an unrealistic simulated collision. For example, the collision filtering module 510 can cooperate with the simulation module 505 to determine feasibility of the potential evasive maneuvers by testing the potential evasive maneuvers in one or more simulations.

In an example embodiment, a computing device 580 is operatively coupled to the simulation subsystem 445 and configured to enable a human operator (not shown) to interact with one or more of the components of the simulation subsystem 445. The computing device 580 includes a computer or processing system, such as a desktop, laptop, tablet, phone, or other mobile or non-mobile device, which includes one or more types of displays 585 (e.g., a screen or monitor) and one or more input devices 590 (e.g., a keyboard, mouse, voice recognition, etc.) to enter and/or view information. The computing device 580 may include software, such as an internet browser or software application, through which the computing device 580 can communicate with the simulation subsystem 445. For example, a human operator can use the computing device 580 to interact with the simulation module 505, collision filtering module 510, and/or triage module 525 to run and/or configure one or more simulations, analyze results from one or more simulations, assess and/or classify one or more simulated collisions, and/or assess, modify, and/or provision software (e.g., an autonomy stack) and/or data for one or more autonomous vehicles in the real world based on the simulations.

The human operator can, for example, use the computing device 580 to cause a simulation to run to test a particular set of software and can then determine whether/how to modify and/or provision the software based on results of the simulation and/or one or more triage collision analyses, if applicable. The interaction may include, e.g., displaying, by the computing device 580, information regarding, or even a reenactment of, any simulated collision. For example, the computing device 580 can display on the display 585 virtual characters that are similar to, or dissimilar to (but representative of), the simulated autonomous vehicle and agent(s).

In an example embodiment, the human operator can provide input confirming or not confirming classifications by the collision filtering module 510. For example, the collision filtering module 510 can preliminarily classify a simulated collision as a realistic simulated collision or an unrealistic simulated collision, and the human operator can provide input via the computing device 580 to indicate, based on their understanding of the simulated collision, whether the simulated collision is actually a realistic simulated collision or an unrealistic simulated collision. The input from the human operator can be determinative, meaning that the collision filtering module 510 can accept as final the classification by the human operator, or the input from the human operator can be one factor of multiple factors considered by the collision filtering module 510 in classifying the simulated collision.

Though illustrated as being connected directly to the simulation subsystem 445, it should be recognized that the computing device 580 could be located remote from the simulation subsystem 445 (and/or a fleet management system that includes the simulation subsystem 445) in alternative example embodiments. For example, the computing device 580 can interface with the simulation subsystem 445 and/or components thereof via one or more wireless or wired networks. Similarly, it should be recognized that the data store 545 can be located remote from the simulation subsystem 445, e.g., in a cloud or data center solution, or integrated in one or more other components of the fleet management system or another system, in alternative example embodiments.

Figure 6:
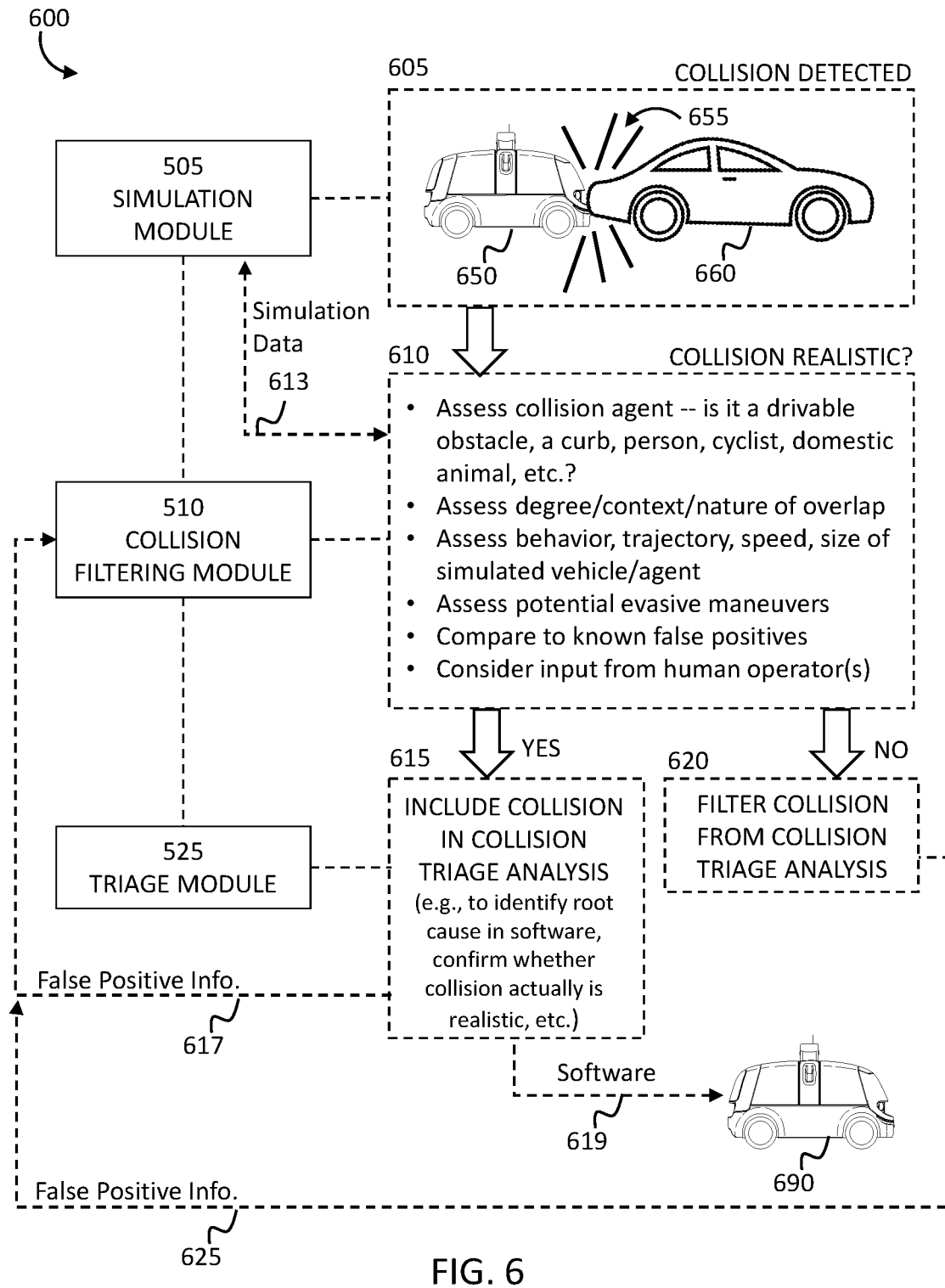
FIG. 6 is a diagram depicting an operational flow for providing collision filtering for autonomous vehicle simulations, according to an example embodiment.

FIG. 6 is a diagram depicting an operational flow 600 for providing collision filtering for autonomous vehicle simulations, according to an example embodiment. The operational flow 600 involves modules of a simulation subsystem, including the simulation module 505, collision filtering module 510, and triage module 525. In a first stage 605, the simulation module 505 simulates operation of an autonomous vehicle using a simulated autonomous vehicle 650. The simulation module 505 identifies a simulated collision 655 involving the simulated autonomous vehicle 650 and a simulated agent 660. While the simulated agent 660 is depicted in FIG. 6 as another simulated vehicle, it should be appreciated that the simulated agent 660 can include any obstacle with which an autonomous vehicle could collide, such as an infrastructure element, an actor, a weather/environmental element, and/or another object in a simulation environment.

In a second stage 610, the collision filtering module 510 analyzes the simulated collision 655 to determine whether the simulated collision 655 can be classified as a realistic simulated collision or an unrealistic simulated collision. This analysis can include, e.g., assessing the agent 660, a nature of the collision, whether the collision is avoidable through an evasive maneuver, whether the collision is similar to a known false positive, and/or input from a human operator. For example, the collision filtering module 510 can determine whether the agent 660 constitutes a drivable obstacle. A drivable obstacle is anything that an autonomous vehicle can drive through/over safely, such as rain, dust clouds, bugs, leaves, fog, water from sprinklers, exhaust from vehicles, etc. Obstacles that are not drivable include anything that an autonomous vehicle would not (or should not) drive through/over, such as an overhanging tree, a tree branch, a palm frond, road debris, a paper bag with unidentified contents, a cinder block, cone, tire, or other object in the road, a curb, etc.

The collision filtering module 510 also can consider other features of the agent 660, such as a relative size, shape, and/or type of the agent 660. For example, the collision filtering module 510 can be configured conservatively to always or substantially always consider collisions with pedestrians, cyclists, motorcyclists, or other human actors; dogs, cats, rabbits, and other domestic animals; curbs and other defined infrastructure elements; and other items having certain sizes and/or shapes, as realistic simulated collisions. Similarly, the collision filtering module 510 can be configured to classify other types of agents 660, such as birds, rodents, squirrels, and other small/undomesticated animals or other items, as well as items having certain sizes and/or shapes, as unrealistic simulated collisions.

The collision filtering module 510 also can consider a nature of the simulated collision 655, such as a degree, context, and/or nature of overlap between the simulated autonomous vehicle 650 and agent 660, and/or a behavior, trajectory/direction, speed, etc. of the simulated autonomous vehicle 650 and/or agent 660. For example, if there is a significant divergence (e.g., approximately four car lengths) between the simulated autonomous vehicle 650 and agent 660, if the simulated autonomous vehicle 650 is stationary/stalled, if the simulated collision 655 takes place in an undriveable zone, if the simulated collision 655 takes place more than a threshold amount of time after the simulated autonomous vehicle 650 decelerates or pulls over, or if the context otherwise dictates, the collision filtering module 510 can classify the simulated collision 655 as an unrealistic simulated collision. Similarly, if the simulated collision 655 underreacts or reacts poorly to the agent 660, e.g., by violating a right of way of the agent 660, violates a traffic law, or context otherwise dictates, the collision filtering module 510 can classify the simulated collision 655 as a realistic simulated collision.

As described above, the collision filtering module 510 also can be configured to consider whether any potential evasive maneuvers would avoid the simulated collision 655 and/or whether the simulated collision 655 is similar to any known false positives. For example, the collision filtering module 510 can evaluate feasibility of one or more of various different potential evasive maneuvers, e.g., by cooperating with the simulation module 505 to simulate the potential evasive maneuvers using simulation data 613 for the potential evasive maneuvers. The collision filtering module 510 and/or simulation module 505 can determine, for each potential evasive maneuver, whether the potential evasive maneuver could reasonably have avoided the simulated collision 655. Similarly, the collision filtering module 510 can determine a degree of similarity between the simulated collision 655 and one or more known false positive using a machine learning model or other logic.

If a threshold number of potential evasive maneuvers (e.g., one or more potential evasive maneuvers) are determined to reasonably avoid the simulated collision 655, and/or if one or more potential evasive maneuvers successfully avoid the simulated collision 655 a threshold number of times in simulation, or with a confidence or probability score from the simulation above a threshold level, and/or if the simulated collision 655 has a similarity score with false positives data at or above a threshold level, the collision filtering module 510 may determine that the simulated collision 655 is an unrealistic simulated collision. Similarly, if there are less than a threshold number of potential evasive maneuvers that could reasonably avoid the simulated collision 655, and/or if no potential evasive maneuvers successfully avoid the simulated collision 655 a threshold number of times in simulation, or with a confidence or probability score from the simulation above a threshold level, and/or if the simulated collision 655 has a similarity score with false positives data below a threshold level, the collision filtering module 510 may determine that the simulated collision 655 is a realistic simulated collision—or at least that it is not an unrealistic simulated collision on the basis of being avoidable through an evasive maneuver or being similar to a known false positive.

As may be appreciated, the example considerations presented herein are illustrative, and additional, less, or different considerations may be included in alternative example embodiments. For example, in addition or in lieu of comparing simulation data to known false positives data, a comparison may be made to information regarding known realistic collisions, e.g., to determine whether the simulated collision 655 is substantially similar to one or more simulated collisions previously classified as realistic and/or one or more actual collisions experienced by one or more vehicles in a real-world environment. In addition, it should be appreciated that each of the various considerations may factor differently into the determination regarding whether a particular collision is a realistic simulated collision. For example, certain considerations may be determinative while certain other considerations may be non-determinative factors weighing towards or against a particular (realistic or unrealistic) classification. The considerations and their relative factors may be customizable, for example, by the simulation subsystem and/or a human operator.

If the collision filtering module 510 determines in the second stage 610 that the simulated collision 655 is a realistic simulated collision, then the operation flow 600 continues to a third stage 615 in which the simulated collision 655 is included in a collision triage analysis. For example, the collision triage analysis can include a detailed analysis of the simulated collision 655 to confirm whether the simulated collision 655 is actually a realistic simulated collision and/or to determine and address a root cause for the simulated collision 655. If the collision triage analysis determines that the simulated collision 655 is actually not a realistic simulated collision, then the triage module 525 can provide false positive information 617 to the collision filtering module 510 to potentially prevent future simulated collisions that are similar to the simulated collision 655 from being identified as realistic simulated collisions.

The root cause analysis can involve, e.g., analysis, and/or modification of, an autonomy stack and/or other software and/or data associated with the simulated collision 655. For example, the triage module 525 may be configured to (e.g., in cooperation with one or more other systems or subsystems internal or external to the simulation subsystem) modify the software and/or data to mitigate risk of the simulated collision 655 in future simulations and/or real-world applications of the software. The triage module 525 (or one or more other systems or subsystems) may provide the modified software 619 to one or more autonomous vehicles 690 for use in the real world.

If the collision filtering module 510 determines in the second stage 610 that the simulated collision 655 is not a realistic simulated collision, then the operation flow 600 continues to a fourth stage 620 in which the simulated collision 655 is filtered from being included in any collision triage analysis. Information 625 regarding the simulated collision also may be provided to the collision filtering module 510, e.g., for storage as false positives data or otherwise, to potentially prevent future simulated collisions that are similar to the simulated collision 655 from being identified as realistic simulated collisions.

Figure 7:
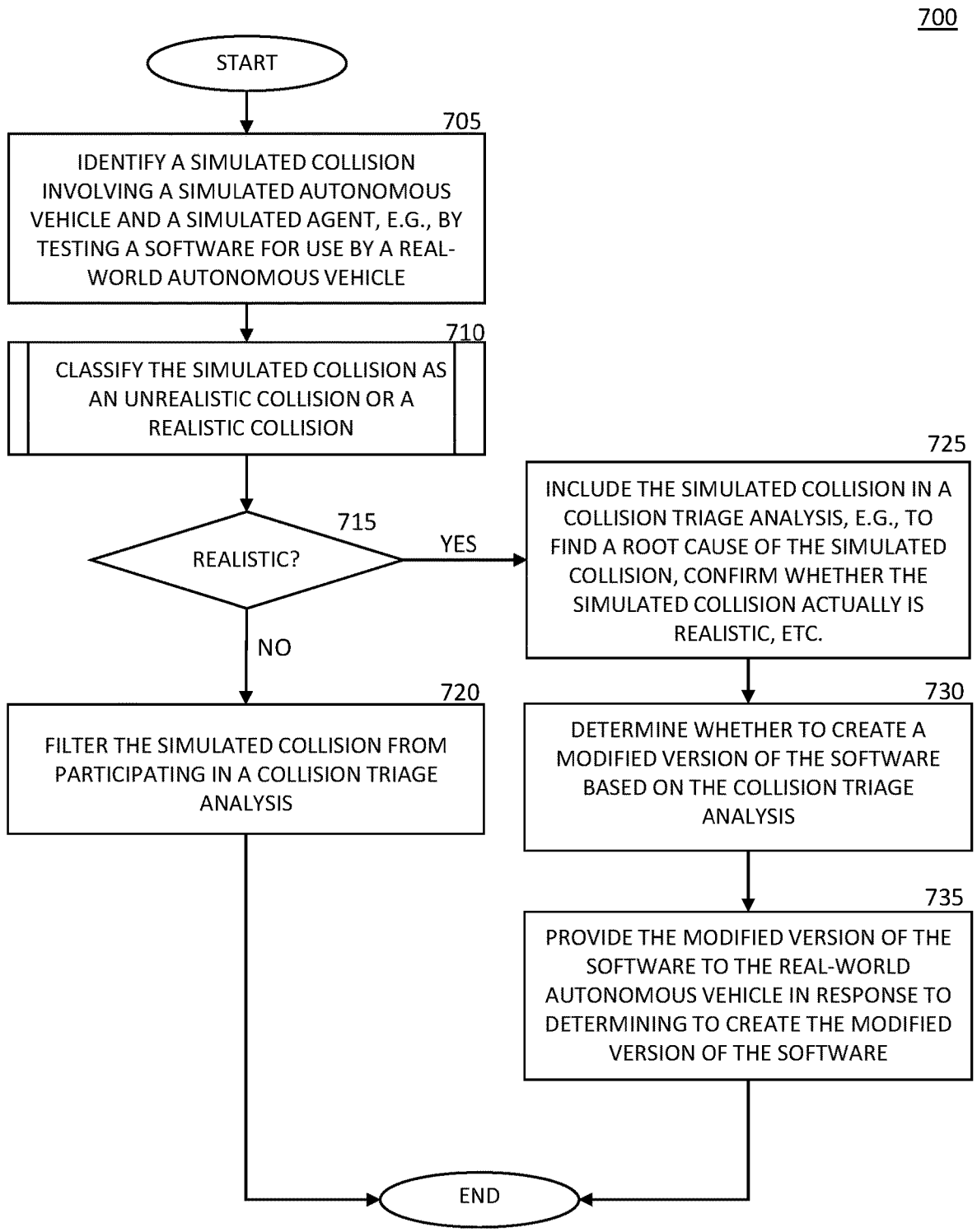
FIG. 7 is a flow chart of a method for providing collision filtering for autonomous vehicle simulations, according to an example embodiment.

FIG. 7 is a flow chart of a method 700 for providing collision filtering for autonomous vehicle simulations, according to an example embodiment. In step 705, a simulation module of a simulation subsystem identifies a simulated collision involving a simulated autonomous vehicle and a simulated agent. For example, the simulation module may identify the simulated collision as part of testing a software for use by a real-world autonomous vehicle. The simulated autonomous vehicle may, e.g., behave similarly to the real-world autonomous vehicle.

In step 710, a collision filtering module of the simulation subsystem classifies the simulated collision as an unrealistic simulated collision or a realistic simulated collision. For example, classification can involve considering a nature of the agent (including, e.g., whether the simulated agent is a drivable obstacle), a nature of the collision, whether the collision is avoidable through an evasive maneuver, whether the collision is similar to a known false positive, and/or input from a human operator. Step 710 is described in more detail below with reference to FIG. 8.

If, at 715, the collision filtering module classifies the simulated collision as an unrealistic simulated collision, the method 700 continues to step 720 in which the collision filtering module filters the simulated collision from participating in a collision triage analysis. If, at 715, the collision filtering module classifies the simulated collision as realistic, the method 700 continues to step 725.

In step 725, the collision filtering module includes the simulated collision in a collision triage analysis. For example, a triage module of the simulation subsystem can analyze the simulated collision to find a root cause of the simulated collision and/or to confirm whether the simulated collision actually is realistic. In step 730, the triage module determines whether to create a modified version of the software based on the collision triage analysis. For example, if the collision triage analysis confirms that the simulated collision actually is realistic and that one or more features of the software constitute a root cause of the simulated collision, the triage module may determine to create a modified version of the software to change the one or more features and, thereby, mitigate a risk associated with the software. In step 735, the simulation subsystem causes any modified software created in response to step 730 to be provided to the real-world autonomous vehicle. For example, an updated autonomy stack or other software may be provided to the real-world autonomous vehicle in step 735 to mitigate a risk of collisions similar to the simulated collision.

Figure 8:
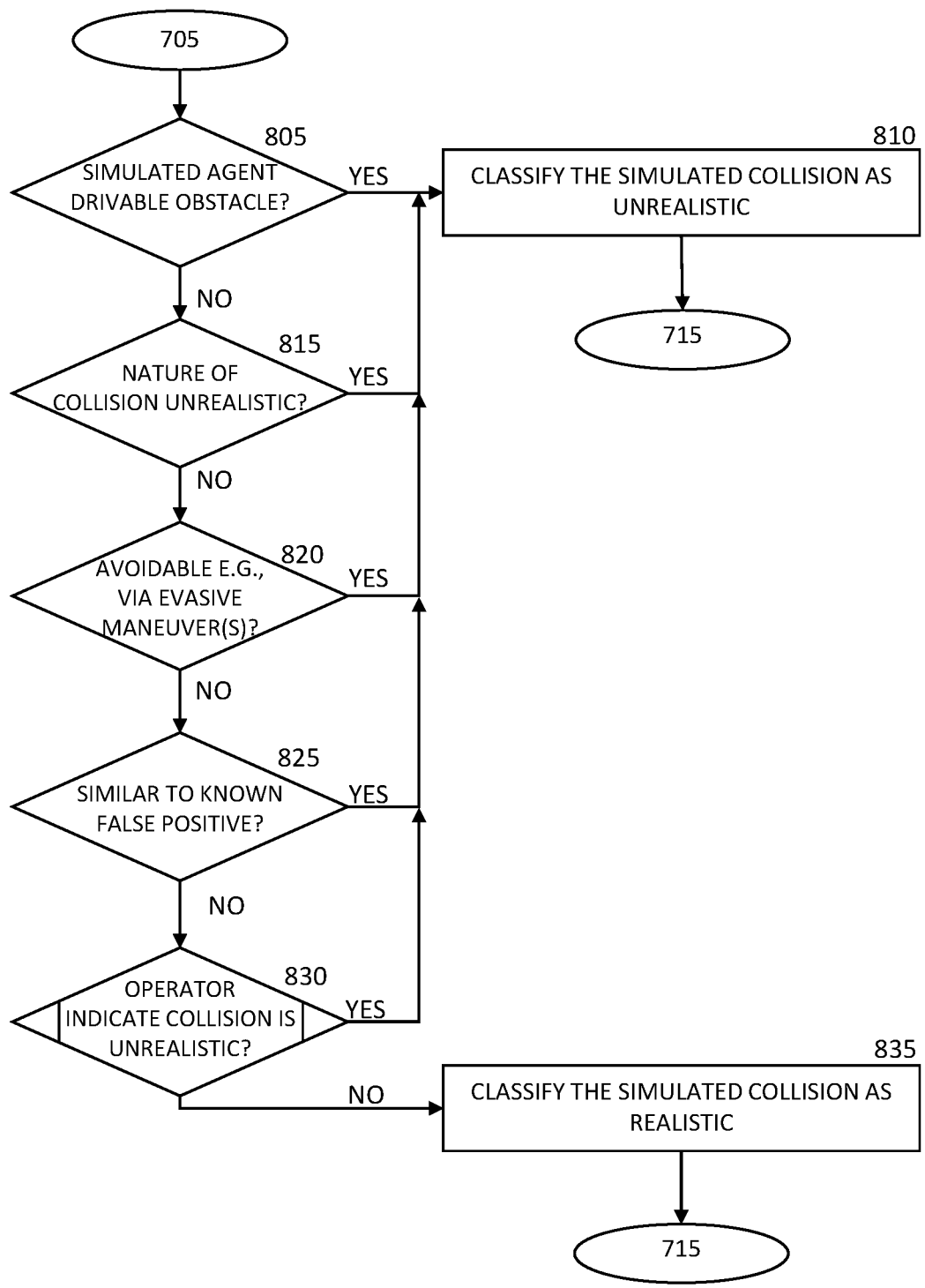
FIG. 8 is a flow chart of a method for classifying simulated collisions for collision filtering for autonomous vehicle simulations, according to an example embodiment.

FIG. 8 is a flow chart depicting in more detail operations that may be performed at step 710 for classifying simulated collisions for collision filtering for autonomous vehicle simulations, according to an example embodiment. The operations of step 710 continue from step 705 of the method 700 described above. In step 805, the collision filtering module determines whether the simulated agent is a drivable obstacle, i.e., anything that an autonomous vehicle can drive through/over safely, such as rain, dust clouds, bugs, leaves, fog, water from sprinklers, exhaust from vehicles, etc. For example, obstacles that are not drivable can include anything that an autonomous vehicle would not (or should not) drive through/over, such as an overhanging tree, a tree branch, a palm frond, road debris, a paper bag with unidentified contents, a cinder block, cone, tire, or other object in the road, a curb, etc. The collision filtering module can consider, for example, one or more features of the agent, like the size, shape, and/or type of the agent, in making the determination in step 805.

If the collision filtering module determines in step 805 that the simulated agent is a drivable obstacle, then the operations of step 710 continue to step 810 in which the collision filtering module classifies the simulated collision as unrealistic. If the collision filtering module determines in step 805 that the simulated agent is not a drivable obstacle, then the operations of step 710 continue to step 815 in which the collision filtering module determines whether a nature of the simulated collision is unrealistic. For example, the collision filtering module can identify a point in time at which the simulated vehicle crossed into a path or trajectory of the agent with which the simulated vehicle subsequently collided and consider a degree, context, or nature of overlap between the simulated autonomous vehicle and agent, and/ or a behavior, trajectory/direction, speed, etc. of the simulated autonomous vehicle and/or agent, at or around that point in time, to determine whether the simulated collision is unrealistic.

If the collision filtering module determines in step 815 that the nature of the simulated collision is unrealistic, then the operations of step 710 continue to step 810 in which the collision filtering module classifies the simulated collision as unrealistic. If the collision filtering module determines in step 815 that the nature of the simulated collision is realistic, then the operations of step 710 continue to step 820 in which the collision filtering module determines whether the simulated collision is avoidable, e.g., via one or more evasive maneuvers. For example, an evasive maneuver can include changing a speed and/or trajectory/direction of the simulated autonomous vehicle and/or agent, e.g., by swerving, turning, braking, speeding up, etc.

In an example embodiment, the collision filtering module can cooperate with the simulation module to determine feasibility of one or more of the potential evasive maneuvers by testing the potential evasive maneuvers in one or more simulations. If a threshold number of potential evasive maneuvers (e.g., one or more potential evasive maneuvers) are determined to reasonably avoid the simulated collision, and/or if one or more potential evasive maneuvers successfully avoid the simulated collision a threshold number of times in simulation, or with a confidence or probability score from the simulation above a threshold level, the collision filtering module may determine in step 820 that the simulated collision is avoidable. Similarly, if there are less than a threshold number of potential evasive maneuvers that could reasonably avoid the simulated collision, and/or if no potential evasive maneuvers successfully avoid the simulated collision a threshold number of times in simulation, or with a confidence or probability score from the simulation above a threshold level, the collision filtering module may determine in step 820 that the simulated collision is not avoidable.

If the collision filtering module determines in step 820 that the simulated collision is avoidable, then the operations of step 710 continue to step 810 in which the collision filtering module classifies the simulated collision as unrealistic. If the collision filtering module determines in step 820 that the simulated collision is not avoidable, then the operations of step 710 continue to step 825 in which the collision filtering module determines whether the simulated collision is similar to a known false positive, i.e., a simulated collision that has previously been determined/confirmed to be unrealistic. For example, the collision filtering module can determine whether the simulated collision is similar to a known false positive by using one or more machine learning models and/or other logic for determining a degree of similarity between the simulated collision data and stored false positives data. If, for example, the simulated collision has a similarity score with false positives data at or above a threshold level, the collision filtering module may determine in step 825 that the simulated collision is similar to a known false positive. Similarly, if the simulated collision has a similarity score with false positives data below the threshold level, the collision filtering module may determine in step 825 that the simulated collision is not similar to a known false positive.

If the collision filtering module determines in step 825 that the simulated collision is similar to a known false positive, then the operations of step 710 continue to step 810 in which the collision filtering module classifies the simulated collision as unrealistic. If the collision filtering module determines in step 825 that the simulated collision is not similar to a known false positive, then the operations of step 710 continue to step 830 in which the collision filtering module determines whether a human operator has indicated that the simulated collision is unrealistic. For example, the human operator can interact with the simulation module and/or collision filtering module via one or more computing devices and assess information regarding the simulation to provide input regarding whether they believe the simulated collision is realistic. Step 830 is described in more detail below with reference to FIG. 9.

If the collision filtering module determines in step 830 that the human operator has indicated that the simulated collision is unrealistic, then the operations of step 710 continue to step 810 in which the collision filtering module classifies the simulated collision as unrealistic. If the collision filtering module determines in step 830 that the human operator has not indicated that the simulated collision is unrealistic—for example, because the human operator has indicated that the simulated collision is realistic or because no human operator has provided any indication regarding whether the simulated collision is realistic or unrealistic—then the operations of step 710 continue to step 835 in which the collision filtering module classifies the simulated collision as a realistic simulated collision.

It should be appreciated that the considerations and order of evaluation and relative weights thereof are illustrative and not limiting in any way. For example, in certain example embodiments, additional, less, or different considerations may be included in the operations of step 710. In addition, certain considerations may be determinative while certain other considerations may be non-determinative factors weighing towards or against a particular (realistic or unrealistic) classification.

Figure 9:
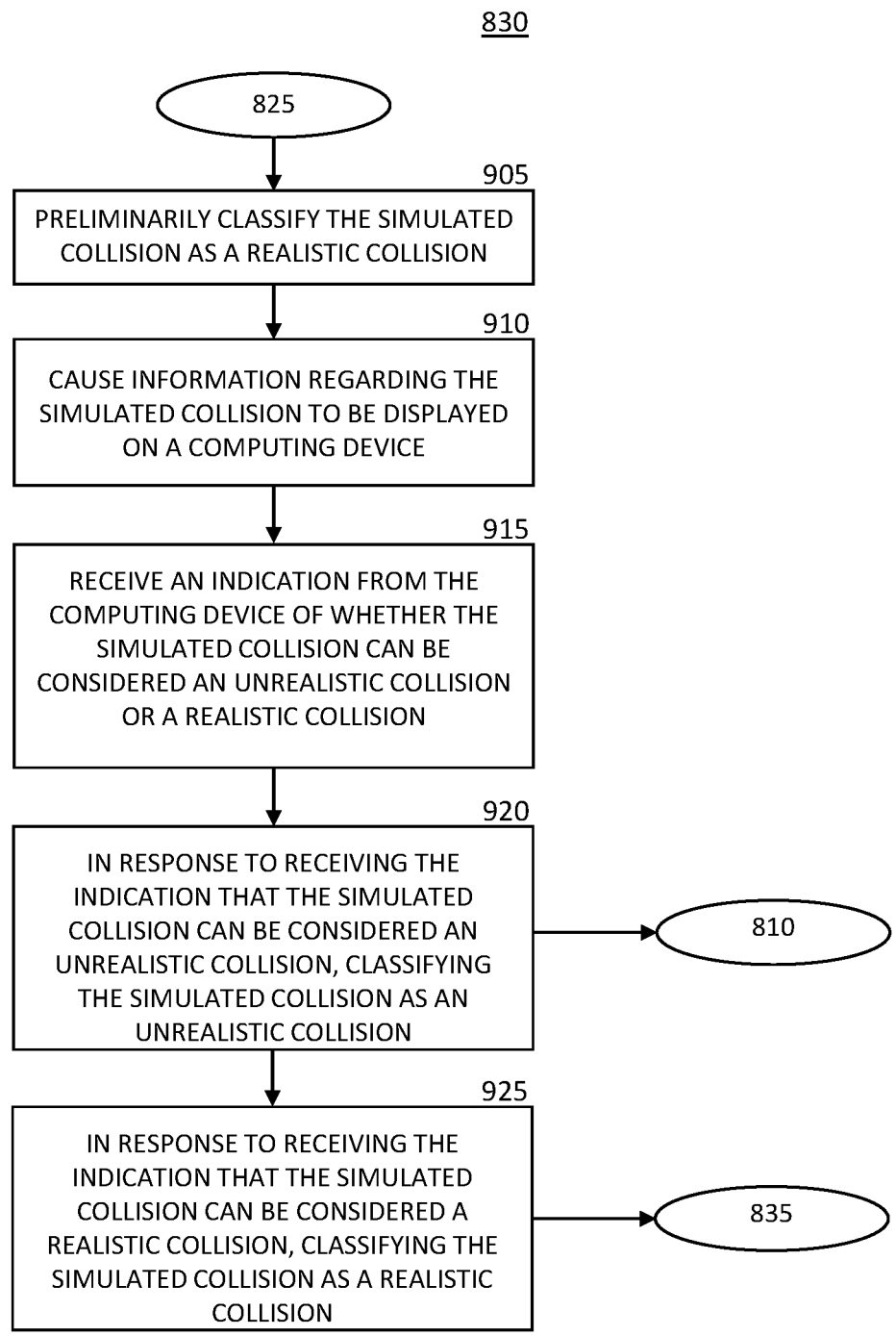
FIG. 9 is a flow chart of a method for receiving operator input for classifying simulated collisions for collision filtering for autonomous vehicle simulations, according to an example embodiment.

FIG. 9 is a flow chart depicting in more detail operations that may be performed at step 830 for receiving operator input for classifying simulated collisions for collision filtering, according to an example embodiment. The operations of step 830 continue from step 825 of the step 710 described above in connection with FIG. 8. In step 905, the collision filtering module preliminarily classifies a simulated collision as a realistic simulated collision. For example, the collision filtering module can preliminarily determine that a nature of the simulated agent, a nature of the collision, a lack of adequate evasive maneuvers, a lack of similarity to any known false positives, and/or other factors weigh in favor of the simulated collision potentially constituting a realistic simulated collision.

In step 910, the collision filtering module causes information regarding the simulated collision to be displayed on a computing device. For example, the collision filtering module can cause information regarding the agent, simulated vehicle, their respective sizes, configurations (or other characteristics), speeds, trajectories, behaviors, etc. to be displayed on a display of the computing device. In addition, or in the alternative, the collision filtering module can cause a reenactment of the simulated collision, e.g., using virtual characters that are similar to, dissimilar to (but representative of), the simulated autonomous vehicle and agent(s), to be displayed on the computing device.

In step 915, the collision filtering module receives an indication from the computing device of whether the simulated collision can be considered an unrealistic simulated collision or a realistic simulated collision. For example, a human operator can provide the indication using one or more input devices on the computing device. The human operator can, for example, provide the indication based on their interpretation of the information displayed in step 910.

In step 920, the collision filtering module classifies the simulated collision as an unrealistic simulated collision in response to receiving an indication in step 915 that the simulated collision can be considered an unrealistic simulated collision. If the simulated collision is classified in step 920 as unrealistic, i.e., if the collision filtering module receives an indication in step 915 that the simulated collision can be considered an unrealistic simulated collision, then the operations of step 830 continue to step 810 of the operations of step 710 described above. If the simulated collision is not classified in step 920 as an unrealistic simulated collision, i.e., if the collision filtering module receives an indication in step 915 that the simulated collision can be considered a realistic simulated collision, then the operations of step 830 continue to step 925 where the collision filtering module classifies the simulated collision as a realistic simulated collision. The operations of step 830 then continue to step 835 of the operations of step 710.

As would be recognized by a person of skill in the art, the steps associated with the operational flows and methods of the present disclosure, including the operational flows and methods presented in FIGS. 7-9 may vary. Steps may be added, removed, altered, combined, and reordered without departing from the spirit or the scope of the present disclosure. Therefore, the example operational flows and methods are to be considered illustrative and not restrictive, and the examples are not to be limited to the details given herein but may be modified within the scope of the appended claims.

Figure 10:
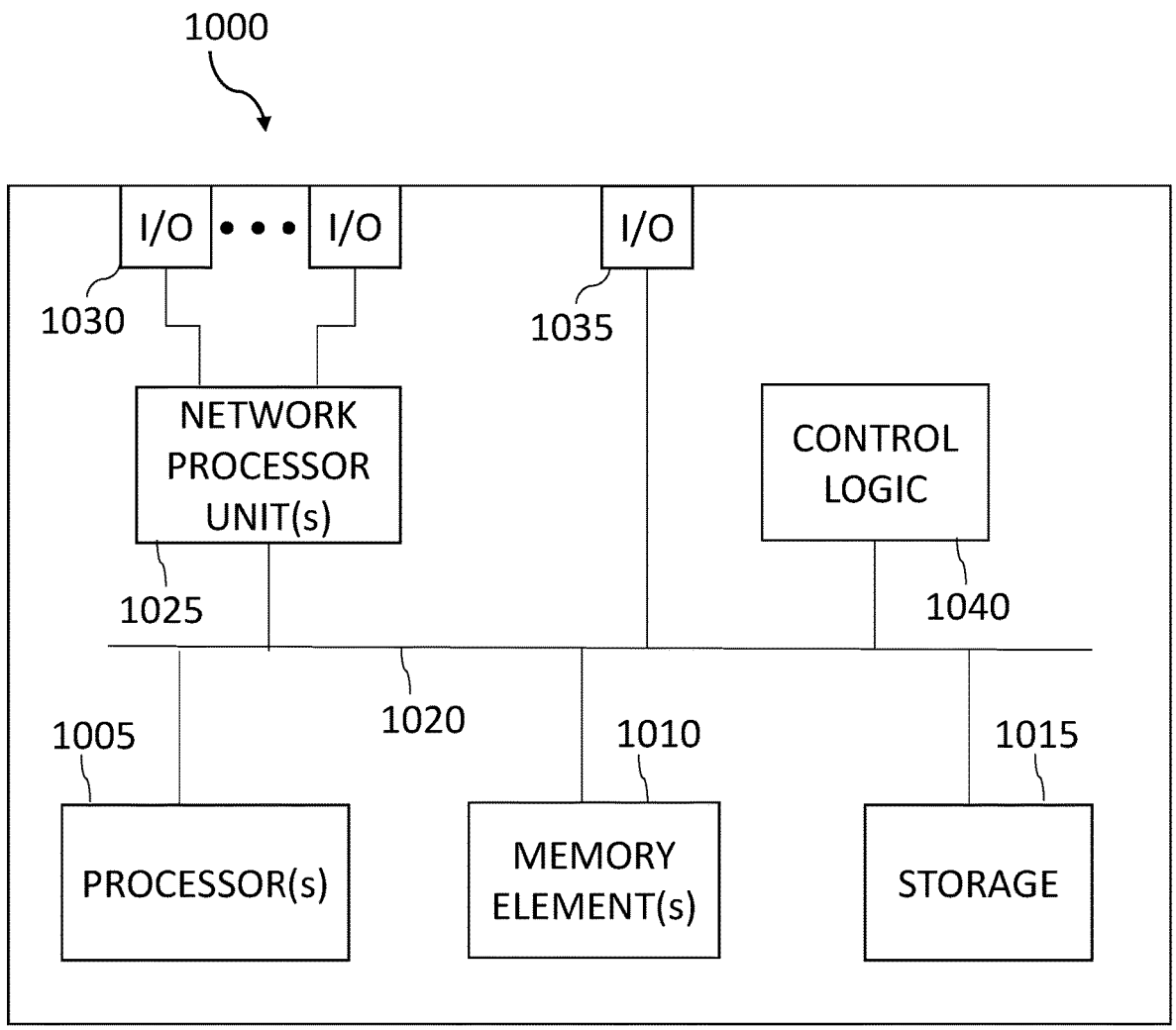
FIG. 10 is a block diagram of a computing device configured to perform functions associated with the techniques described herein, according to an example embodiment.

Referring now to FIG. 10, FIG. 10 illustrates a hardware block diagram of a computing device 1000 that may perform functions associated with operations discussed herein in connection with the techniques depicted in FIGS. 1-9. In various example embodiments, a computing device, such as computing device 1000 or any combination of computing devices 1000, may be configured as any entity/entities as discussed for the techniques depicted in connection with FIGS. 1-9, such as the simulation subsystem 445, in order to perform operations of the various techniques discussed herein.

In at least one embodiment, computing device 1000 may include one or more processor(s) 1005, one or more memory element(s) 1010, storage 1015, a bus 1020, one or more network processor unit(s) 1025 interconnected with one or more network input/output (I/O) interface(s) 1030, one or more I/O interface(s) 1035, and control logic 1040. In various embodiments, instructions associated with logic for computing device 1000 can overlap in any manner and are not limited to the specific allocation of instructions and/or operations described herein.

In at least one embodiment, processor(s) 1005 is/are at least one hardware processor configured to execute various tasks, operations and/or functions for computing device 1000 as described herein according to software and/or instructions configured for computing device. Processor(s) 1005 (e.g., a hardware processor) can execute any type of instructions associated with data to achieve the operations detailed herein. In one example, processor(s) 1005 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term "processor."

In at least one embodiment, memory element(s) 1010 and/or storage 1015 is/are configured to store data, information, software, and/or instructions associated with computing device 1000, and/or logic configured for memory element(s) 1010 and/or storage 1015. For example, any logic described herein (e.g., control logic 1040) can, in various embodiments, be stored for computing device 1000 using any combination of memory element(s) 1010 and/or storage 1015. Note that in some embodiments, storage 1015 can be consolidated with memory element(s) 1010 (or vice versa), or can overlap/exist in any other suitable manner.

In at least one embodiment, bus 1020 can be configured as an interface that enables one or more elements of computing device 1000 to communicate in order to exchange information and/or data. Bus 1020 can be implemented with any architecture designed for passing control, data and/or information between processors, memory elements/storage, peripheral devices, and/or any other hardware and/or software components that may be configured for computing device 1000. In at least one embodiment, bus 1020 may be implemented as a fast kernel-hosted interconnect, potentially using shared memory between processes (e.g., logic), which can enable efficient communication paths between the processes.

In various embodiments, network processor unit(s) 1025 may enable communication between computing device 1000 and other systems, entities, etc., via network I/O interface(s) 1030 to facilitate operations discussed for various embodiments described herein. In various embodiments, network processor unit(s) 1025 can be configured as a combination of hardware and/or software, such as one or more Ethernet driver(s) and/or controller(s) or interface cards, Fibre Channel (e.g., optical) driver(s) and/or controller(s), and/or other similar network interface driver(s) and/or controller(s) now known or hereafter developed to enable communications between computing device 1000 and other systems, entities, etc. to facilitate operations for various embodiments described herein. In various embodiments, network I/O interface(s) 1030 can be configured as one or more Ethernet port(s), Fibre Channel ports, and/or any other I/O port(s) now known or hereafter developed. Thus, the network processor unit(s) 1025 and/or network I/O interfaces 1030 may include suitable interfaces for receiving, transmitting, and/or otherwise communicating data and/or information in a network environment.

I/O interface(s) 1035 allow for input and output of data and/or information with other entities that may be connected to computer device 1000. For example, I/O interface(s) 1035 may provide a connection to external devices such as a keyboard, keypad, a touch screen, and/or any other suitable input device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 1040 can include instructions that, when executed, cause processor(s) 1005 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 1040) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term "memory element." Data/information being tracked and/or sent to one or more entities as discussed herein could be provided in any database, table, register, list, cache, storage, and/or storage structure: all of which can be referenced at any suitable timeframe. Any such storage options may also be included within the broad term "memory element" as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software (potentially inclusive of object code and source code), etc.) for execution by one or more processor(s), and/or other similar machine, etc. Generally, memory element(s) 1010 and/or storage 1015 can store data, software, code, instructions (e.g., processor instructions), logic, parameters, combinations thereof, and/or the like used for operations described herein. This includes memory element(s) 1010 and/or storage 1015 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

In summary, in one form, a computer-implemented method can include identifying, by a simulation system, a simulated collision involving a simulated autonomous vehicle and a simulated agent representing an obstacle with which the simulated autonomous vehicle may collide. The simulation system can classify the simulated collision as one of an unrealistic simulated collision or a realistic simulated collision and filter the simulated collision from participating in a collision triage analysis in response to classifying the simulated collision as an unrealistic simulated collision.

For example, identifying can comprise simulating a behavior by the simulated autonomous vehicle based on logged data from a real-world autonomous vehicle. Simulating can, e.g., be used to test a software for use by a real-world autonomous vehicle. In an example embodiment, the simulation system can include the simulated collision in the collision triage analysis in response to classifying the simulated collision as a realistic simulated collision, the collision triage analysis comprising an analysis of at least one of the software, or data regarding the simulated collision, to identify a root cause of the simulated collision. A determination can be made regarding whether to create a modified version of the software based on the collision triage analysis. The modified version of the software can be provided to the real-world autonomous vehicle in response to determining to create the modified version of the software.

Classifying can be based on any of a number of different factors. For example, classifying can be based at least in part on a nature of the simulated agent, a nature of the simulated collision, and/or whether the simulated agent could have reasonably avoided the simulated collision by executing an evasive maneuver. For example, determining whether the simulated agent could have reasonably avoided the simulated collision by executing the evasive maneuver can include identifying a plurality of potential evasive maneuvers, and, for each one of the plurality of potential evasive maneuvers, determining whether the one of the plurality of potential evasive maneuvers would have reasonably avoided the simulated collision. Classifying can include, for example, testing the evasive maneuver in a simulation. In addition, or in the alternative, classifying can include comparing data regarding the simulated collision against data regarding known unrealistic simulated collisions to determine whether the simulated collision is substantially similar to a known unrealistic simulated collision, and classifying the simulated collision as an unrealistic simulated collision in response to determining that the simulated collision is substantially similar to a known unrealistic simulated collision. In addition, or in the alternative, classifying can include, in response to preliminarily classifying, by the simulation system, the simulated collision as a realistic simulated collision: causing, by the simulation system, information regarding the simulated collision to be displayed on a computing device; obtaining, by the simulation system, an indication from the computing device regarding whether the simulated collision can be considered an unrealistic simulated collision or a realistic simulated collision; in response to obtaining the indication that the simulated collision can be considered an unrealistic simulated collision, classifying, by the simulation system, the simulated collision as an unrealistic simulated collision; and in response to obtaining the indication that the simulated collision can be considered a realistic simulated collision, classifying, by the simulation system, the simulated collision as a realistic simulated collision.

In another form, an apparatus can include one or more memories configured to store data, and one or more processors coupled to the one or more memories and configured to perform operations including: identifying a simulated collision involving a simulated autonomous vehicle and a simulated agent representing an obstacle with which the simulated autonomous vehicle may collide; classifying the simulated collision as one of an unrealistic simulated collision or a realistic simulated collision; and filtering the simulated collision from participating in a collision triage analysis in response to classifying the simulated collision as an unrealistic simulated collision.

In another form, one or more non-transitory computer readable storage media can include instructions that, when executed by at least one processor, are operable to: identify a simulated collision involving a simulated autonomous vehicle and a simulated agent representing an obstacle with which the simulated autonomous vehicle may collide; classify the simulated collision as one of an unrealistic simulated collision or a realistic simulated collision; and filter the simulated collision from participating in a collision triage analysis in response to classifying the simulated collision as an unrealistic simulated collision.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™, mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A computer-implemented method comprising:
   identifying, by a simulation system, a simulated collision involving a simulated autonomous vehicle and a simulated agent representing an obstacle with which the simulated autonomous vehicle may collide;
   classifying, by the simulation system, the simulated collision as one of an unrealistic simulated collision or a realistic simulated collision, wherein the realistic simulated collision is an actionable collision that is to be avoided in a real world and the unrealistic simulated collision is a collision that occurs in the real world and is not to be avoided in the real world;
   filtering, by the simulation system, the simulated collision from participating in a collision triage analysis in response to classifying the simulated collision as the unrealistic simulated collision; and
   provisioning an autonomous system for controlling an autonomous vehicle based on the collision triage analysis.

2. The computer-implemented method of claim 1, wherein identifying comprises simulating a behavior by the simulated autonomous vehicle based on logged data from the autonomous vehicle.

3. The computer-implemented method of claim 1, wherein identifying comprises simulating a behavior by the simulated autonomous vehicle to test a software for use by the autonomous vehicle.

4. The computer-implemented method of claim 3, further comprising:
   including the simulated collision in the collision triage analysis in response to classifying the simulated collision as the realistic simulated collision, the collision triage analysis comprising an analysis of at least one of the software, or data regarding the simulated collision, to identify a root cause of the simulated collision.

5. The computer-implemented method of claim 4, further comprising:
   determining whether to create a modified version of the software based on the collision triage analysis; and
   providing the modified version of the software to the autonomous vehicle in response to determining to create the modified version of the software, wherein the autonomous system of the autonomous vehicle is provisioned with the modified version of the software.

6. The computer-implemented method of claim 1, wherein the classifying is based at least in part on a nature of the simulated agent.

7. The computer-implemented method of claim 1, wherein the classifying is based at least in part on a nature of the simulated collision.

8. The computer-implemented method of claim 1, wherein the classifying is based at least in part on whether the simulated agent could have reasonably avoided the simulated collision by executing an evasive maneuver.

9. The computer-implemented method of claim 8, wherein the classifying comprises determining whether the simulated agent could have reasonably avoided the simulated collision by executing the evasive maneuver by:
   identifying a plurality of potential evasive maneuvers; and
   for each one of the plurality of potential evasive maneuvers, determining whether the one of the plurality of potential evasive maneuvers would have reasonably avoided the simulated collision.

10. The computer-implemented method of claim 8, wherein the classifying comprises testing the evasive maneuver in a simulation.

11. The computer-implemented method of claim 1, wherein the classifying comprises:
comparing first data regarding the simulated collision against second data regarding known unrealistic simulated collisions to determine whether the simulated collision is substantially similar to a known unrealistic simulated collision; and
classifying the simulated collision as the unrealistic simulated collision in response to determining that the simulated collision is substantially similar to the known unrealistic simulated collision.

12. The computer-implemented method of claim 1, wherein classifying comprises, in response to preliminarily classifying, by the simulation system, the simulated collision as the realistic simulated collision:
causing, by the simulation system, information regarding the simulated collision to be displayed on a computing device;
obtaining, by the simulation system, an indication from the computing device regarding whether the simulated collision is to be considered the unrealistic simulated collision or the realistic simulated collision;
in response to obtaining the indication that the simulated collision is to be considered the unrealistic simulated collision, classifying, by the simulation system, the simulated collision as the unrealistic simulated collision; and
in response to obtaining the indication that the simulated collision is to be considered the realistic simulated collision, classifying, by the simulation system, the simulated collision as the realistic simulated collision.

13. The computer-implemented method of claim 1, wherein classifying the simulated collision includes:
comparing first characteristics information regarding the simulated collision with second characteristics information regarding a plurality of false positive simulated collisions to determine a similarity score; and
determining that the simulated collision is the unrealistic simulated collision based on the similarity score being above a predetermined threshold value.

14. The computer-implemented method of claim 1, wherein the unrealistic simulated collision involves a drivable obstacle as the simulated agent with which the autonomous vehicle collides.

15. An apparatus comprising:
one or more memories configured to store data; and
one or more processors coupled to the one or more memories and configured to perform operations including:
identifying a simulated collision involving a simulated autonomous vehicle and a simulated agent representing an obstacle with which the simulated autonomous vehicle may collide;
classifying the simulated collision as one of an unrealistic simulated collision or a realistic simulated collision, wherein the realistic simulated collision is an actionable collision that is to be avoided in a real world and the unrealistic simulated collision is a collision that occurs in the real world and is not to be avoided in the real world;
filtering the simulated collision from participating in a collision triage analysis in response to classifying the simulated collision as the unrealistic simulated collision; and
providing software for provisioning an autonomous system for controlling an autonomous vehicle based on the collision triage analysis.

16. The apparatus of claim 15, wherein the one or more processors are further configured to identify the simulated collision by simulating a behavior by the simulated autonomous vehicle based on logged data from the autonomous vehicle.

17. The apparatus of claim 15, wherein the one or more processors are further configured to identify the simulated collision by simulating a behavior by the simulated autonomous vehicle to test the software for use by the autonomous vehicle.

18. The apparatus of claim 17, wherein the one or more processors are further configured to use the simulated collision in the collision triage analysis in response to classifying the simulated collision as the realistic simulated collision, the collision triage analysis comprising an analysis of at least one of the software, or data associated with the simulated collision, to identify a root cause of the simulated collision.

19. The apparatus of claim 18, wherein the one or more processors are further configured to:
determine whether to create a modified version of the software based on the collision triage analysis; and
provide the modified version of the software to the autonomous vehicle in response to determining to create the modified version of the software, wherein the autonomous system of the autonomous vehicle is provisioned with the modified version of the software.

20. The apparatus of claim 15, wherein the one or more processors are further configured to classify the simulated collision based at least in part on whether the simulated agent could have reasonably avoided the simulated collision by executing an evasive maneuver.

21. The apparatus of claim 15, wherein the one or more processors are further configured to classify the simulated collision by:
comparing first data regarding the simulated collision against second data regarding known unrealistic simulated collisions to determine whether the simulated collision is substantially similar to a known unrealistic simulated collision; and
classifying the simulated collision as the unrealistic simulated collision in response to determining that the simulated collision is substantially similar to the known unrealistic simulated collision.

22. The apparatus of claim 15, wherein the one or more processors are further configured to classify the simulated collision by:
in response to preliminarily classifying the simulated collision as the realistic simulated collision:
causing information regarding the simulated collision to be displayed on a computing device;
obtaining an indication from the computing device, the indication of whether the simulated collision is to be considered the unrealistic simulated collision or the realistic simulated collision;
in response to obtaining the indication that the simulated collision is to be considered the unrealistic simulated collision, classifying the simulated collision as the unrealistic simulated collision; and
in response to obtaining the indication that the simulated collision is to be considered the realistic simulated collision, classifying the simulated collision as the realistic simulated collision.

23. One or more non-transitory computer readable storage media comprising instructions that, when executed by at least one processor, are operable to:

identify a simulated collision involving a simulated autonomous vehicle and a simulated agent representing an obstacle with which the simulated autonomous vehicle may collide;

classify the simulated collision as one of an unrealistic simulated collision or a realistic simulated collision, wherein the realistic simulated collision is an actionable collision that is to be avoided in a real world and the unrealistic simulated collision is a collision that occurs in the real world and is not to be avoided in the real world;

filter the simulated collision from participating in a collision triage analysis in response to classifying the simulated collision as the unrealistic simulated collision; and provide software for provisioning an autonomous system for controlling an autonomous vehicle based on the collision triage analysis.

24. The one or more non-transitory computer readable storage media of claim 23, wherein the instructions, when executed by at least one processor, are further operable to identify the simulated collision by simulating a behavior by the simulated autonomous vehicle based on logged data from the autonomous vehicle.

25. The one or more non-transitory computer readable storage media of claim 23, wherein the instructions, when executed by at least one processor, are further operable to identify the simulated collision by simulating a behavior by the simulated autonomous vehicle to test a software for use by the autonomous vehicle.

26. The one or more non-transitory computer readable storage media of claim 25, wherein the instructions, when executed by at least one processor, are further operable to use the simulated collision in the collision triage analysis in response to classifying the simulated collision as the realistic simulated collision, the collision triage analysis comprising an analysis of at least one of the software, or data associated with the simulated collision, to identify a root cause of the simulated collision.

27. The one or more non-transitory computer readable storage media of claim 26, wherein the instructions, when executed by at least one processor, are further operable to:
determine whether to create a modified version of the software based on the collision triage analysis; and
provide the modified version of the software to the autonomous vehicle for provisioning in response to determining to create the modified version of the software.

28. The one or more non-transitory computer readable storage media of claim 23, wherein the instructions, when executed by at least one processor, are further operable to classify the simulated collision based at least in part on whether the simulated agent could have reasonably avoided the simulated collision by executing an evasive maneuver.

* * * * *